(12) United States Patent
Kang et al.

(10) Patent No.: US 11,925,092 B2
(45) Date of Patent: Mar. 5, 2024

(54) DISPLAY APPARATUS COMPRISING PARTITION WALL AND QUANTUM DOT LAYER

(71) Applicant: SAMSUNG DISPLAY CO., LTD., Yongin-si (KR)

(72) Inventors: Shintack Kang, Yongin-si (KR); Yujin Kim, Yongin-si (KR); Hyunseok Kim, Yongin-si (KR); Kunhee Jo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/071,151

(22) Filed: Nov. 29, 2022

(65) Prior Publication Data
US 2023/0085978 A1    Mar. 23, 2023

Related U.S. Application Data

(63) Continuation of application No. 17/136,690, filed on Dec. 29, 2020, now Pat. No. 11,527,581.

(30) Foreign Application Priority Data

May 18, 2020 (KR) .......................... 10-2020-0059329

(51) Int. Cl.
*H10K 59/38* (2023.01)
*H10K 50/844* (2023.01)
(Continued)

(52) U.S. Cl.
CPC ........... *H10K 59/38* (2023.02); *H10K 50/844* (2023.02); *H10K 59/12* (2023.02); *H10K 71/00* (2023.02); *H10K 59/1201* (2023.02)

(58) Field of Classification Search
CPC ............... H01L 27/322; H01L 27/3244; H01L 51/5253; H01L 51/56; H01L 2227/323;
(Continued)

(56) References Cited

U.S. PATENT DOCUMENTS 9,971,198 B2 * 5/2018 Cho .................. G02F 1/133617
10,361,259 B2   7/2019 Choi et al.
(Continued)

FOREIGN PATENT DOCUMENTS

CN        109830620 A    5/2019
KR     20150002341 A    1/2015
(Continued)

OTHER PUBLICATIONS

Extended European Search Report for Application No. 21173949.5 dated Oct. 20, 2021.
(Continued)

*Primary Examiner* — Caleb E Henry
(74) *Attorney, Agent, or Firm* — CANTOR COLBURN LLP

(57) ABSTRACT

A method of manufacturing a display apparatus includes: forming a display element layer above a lower substrate, where the display element layer includes first to third display elements; forming an encapsulation layer on the display element layer; forming first partition walls on the encapsulation layer to define first to third color regions, where the first to third color regions overlap the first to third display elements, respectively, in a view in a direction perpendicular to the lower substrate; forming second partition walls on the first partition walls; forming a quantum dot layer, which includes forming a second color quantum dot layer in the second color region and forming a third color quantum dot layer in the third color region; and removing the second partition walls.

16 Claims, 22 Drawing Sheets

(51) Int. Cl.
*H10K 59/12* (2023.01)
*H10K 71/00* (2023.01)

(58) Field of Classification Search
CPC ......... H01L 2251/5369; H01L 27/3246; H01L 27/3248; H01L 27/3262; H01L 51/0026; H01L 51/502; H01L 51/5036; H01L 51/5246; H01L 51/5271; G02B 5/201; G02B 5/206
See application file for complete search history.

(56) References Cited

U.S. PATENT DOCUMENTS

| | | | | |
|---|---|---|---|---|
| 2008/0303419 | A1* | 12/2008 | Fukuda | H10K 59/122 313/506 |
| 2010/0219427 | A1* | 9/2010 | Fukuda | H10K 50/852 257/89 |
| 2011/0006313 | A1* | 1/2011 | Sumioka | H10K 50/856 257/E33.072 |
| 2011/0101386 | A1* | 5/2011 | Fukuda | H10K 50/856 257/89 |
| 2011/0233572 | A1* | 9/2011 | Nakatani | H10K 50/824 257/88 |
| 2014/0160408 | A1* | 6/2014 | Cho | G02F 1/133617 349/110 |
| 2016/0204167 | A1* | 7/2016 | Jun | H10K 59/38 257/72 |
| 2016/0372528 | A1* | 12/2016 | Kamura | H01L 31/055 |
| 2017/0003423 | A1* | 1/2017 | Jiang | G02F 1/133514 |
| 2017/0255054 | A1* | 9/2017 | Li | G02F 1/133617 |
| 2017/0315409 | A1* | 11/2017 | Cho | G02F 1/133617 |
| 2018/0031909 | A1* | 2/2018 | Liu | G09G 3/00 |
| 2018/0031910 | A1* | 2/2018 | Li | G02F 1/13394 |
| 2018/0102449 | A1* | 4/2018 | Pschenitzka | C09D 11/322 |
| 2018/0210280 | A1* | 7/2018 | Chen | H10K 50/8445 |
| 2018/0269260 | A1* | 9/2018 | Ghosh | H10K 59/50 |
| 2019/0018286 | A1 | 1/2019 | Kim et al. | |
| 2020/0013766 | A1* | 1/2020 | Kim | H01L 25/167 |
| 2020/0027928 | A1* | 1/2020 | Wu | H10K 59/35 |
| 2020/0043976 | A1 | 2/2020 | Kim et al. | |
| 2020/0089047 | A1 | 3/2020 | Baek et al. | |
| 2020/0091251 | A1* | 3/2020 | Hu | H10K 71/00 |
| 2020/0103709 | A1* | 4/2020 | Madigan | C09D 11/037 |
| 2020/0110494 | A1* | 4/2020 | Chen | G06F 3/044 |
| 2020/0152704 | A1* | 5/2020 | Jang | H10K 59/1201 |
| 2020/0161585 | A1* | 5/2020 | Palles-Dimmock | H10K 50/82 |
| 2020/0212119 | A1* | 7/2020 | Shim | H10K 59/124 |
| 2020/0218084 | A1* | 7/2020 | Zhu | G02B 26/005 |
| 2020/0227484 | A1* | 7/2020 | Lin | H01L 33/502 |
| 2020/0343315 | A1* | 10/2020 | Lin | H10K 59/126 |
| 2021/0026193 | A1* | 1/2021 | Yu | G02F 1/133516 |
| 2021/0074770 | A1* | 3/2021 | Choe | H10K 59/38 |
| 2021/0159268 | A1* | 5/2021 | Heo | H01L 25/0753 |
| 2021/0167146 | A1* | 6/2021 | Yang | H10K 71/221 |
| 2021/0193742 | A1* | 6/2021 | Kim | H10K 50/865 |
| 2021/0201791 | A1* | 7/2021 | Fukasawa | H10K 71/00 |

FOREIGN PATENT DOCUMENTS

| | | |
|---|---|---|
| KR | 101524726 B1 | 6/2015 |
| KR | 101756522 B1 | 7/2017 |
| KR | 1020180018969 A | 2/2018 |
| KR | 101884380 B1 | 8/2018 |
| KR | 101995930 B1 | 7/2019 |
| KR | 1020200016424 A | 2/2020 |

OTHER PUBLICATIONS

Extended European Search Report for Application No. 21173949.5 dated Oct. 20, 2021, citing the above reference(s).

* cited by examiner

DISPLAY APPARATUS COMPRISING PARTITION WALL AND QUANTUM DOT LAYER

This application is a continuation of U.S. patent application Ser. No. 17/136,690, filed on Dec. 29, 2020, which claims priority to Korean Patent Application No. 10-2020-0059329, and all the benefits accruing therefrom under 35 U.S.C. § 119, the content of which in its entirety is herein incorporated by reference.

BACKGROUND

1. Field

One or more embodiments relate to a method of manufacturing a display apparatus, and more particularly, to a method of manufacturing a display apparatus whereby the efficiency of a quantum dot layer may improve.

2. Description of Related Art

A display apparatus visually displays data. In general, the display apparatus may be used as a display of a small product such as a mobile phone or a display of a large product such as a television.

The display apparatus includes a plurality of pixels that receive an electrical signal and emit light to display an image to the outside. Each pixel includes a light-emitting device, and for example, an organic light-emitting display apparatus include an organic light-emitting diode ("OLED") as the light-emitting device. In general, the organic light-emitting display apparatus includes a thin-film transistor and an OLED on a substrate, and the OLED operates by emitting light by itself.

As the display apparatus has been widely used, various designs have been attempted to improve quality of the display apparatus. Particularly, as the display apparatus becomes high-resolution, research has been actively conducted to improve color reproducibility of each pixel of the display apparatus.

SUMMARY

In a method of manufacturing a display apparatus according to the related art, high partition walls are required to increase the amount of quantum dots included in a quantum dot layer, and as partition walls are high, efficiency degradation and defect occurrence of the quantum dot layer are caused.

To solve various problems including the above problem, one or more embodiments include a method of manufacturing a display apparatus whereby the efficiency of a quantum dot layer may improve. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a method of manufacturing a display apparatus includes: forming a display element layer above a lower substrate, where the display element layer includes first to third display elements: forming an encapsulation layer on the display element layer; forming first partition walls on the encapsulation layer to define first to third color regions, where the first to third color regions overlap the first to third display elements, respectively, in a view in a direction perpendicular to the lower substrate; forming second partition walls on the first partition walls; forming a quantum dot layer, which includes forming a second color quantum dot layer in the second color region and forming a third color quantum dot layer in the third color region; and removing the second partition walls.

The forming of the quantum dot layer may include injecting a second color quantum dot layer material into the second color region and injecting a third color quantum dot layer material into the third color region, volatilizing a portion of a material included in the second color quantum dot layer material and a portion of a material included in the third color quantum dot layer material, and curing the second color quantum dot layer material and the third color quantum dot layer material.

The portion of the material included in the second color quantum dot layer material may be a portion of a material other than quantum dots in the second color quantum dot layer material, and the portion of the material included in the third color quantum dot layer material may be a portion of a material other than quantum dots in the third color quantum dot layer material.

The volatilizing may include volatilizing the portion of the material included in the second color quantum dot layer material and the portion of the material included in the third color quantum dot layer material such that a distance from an upper surface of the encapsulation layer to an upper surface of the second color quantum dot layer material and a distance from the upper surface of the encapsulation layer to an upper surface of the third color quantum dot layer material may each be equal to or less than a preset distance in a thickness direction of the lower substrate.

The preset distance may be a distance from the upper surface of the encapsulation layer to an upper surface of the first partition wall in the thickness direction.

The volatilizing may include providing thermal energy to the second color quantum dot layer material and the third color quantum dot layer material.

Upper surfaces of the second partition walls may be hydrophobic.

The method may further include forming a reflective plate covering an upper surface of the encapsulation layer and the first partition walls, where the forming of the second partition walls may include forming second partition walls on portions of the reflective plate covering the first partition walls.

The method may further include removing a portion of the reflective plate that does not cover the first partition walls.

The first to third display elements may include a first color emission layer configured to emit light of a wavelength in a first wavelength band.

The second color quantum dot layer may be configured to convert the light of the wavelength in the first wavelength band into light of a wavelength in a second wavelength band, and the third color quantum dot layer may be configured to convert the light of the wavelength in the first wavelength band into light of a wavelength in a third wavelength band.

The first to third display elements may include first to third pixel electrodes, respectively, and an opposite electrode corresponding to the first to third pixel electrodes, respectively, where the first color emission layer may be between the opposite electrode and each of the first to third pixel electrodes.

According to one or more embodiments, a method of manufacturing a display apparatus includes forming a color filter layer on a first surface of an upper substrate; forming a protective layer on the color filter layer; forming first partition walls on the protective layer, where the first partition walls define first to third color regions; forming second partition walls on the first partition walls; forming a quantum dot layer, which includes forming a second color quantum dot layer in the second color region and forming a third color quantum dot layer in the third color region; and removing the second partition walls.

The forming of the quantum dot layer may include injecting a second color quantum dot layer material into the second color region and injecting a third color quantum dot layer material into the third color region, volatilizing a portion of a material included in the second color quantum dot layer material and a portion of a material included in the third color quantum dot layer material, and curing the second color quantum dot layer material and the third color quantum dot layer material.

The portion of the material included in the second color quantum dot layer material may be a portion of a material other than quantum dots in the second color quantum dot layer material, and the portion of the material included in the third color quantum dot layer material may be a portion of a material other than quantum dots in the third color quantum dot layer material.

The volatilizing may include volatilizing the portion of the material included in the second color quantum dot layer material and the portion of the material included in the third color quantum dot layer material such that a distance from an upper surface of the protective layer to an upper surface of the second color quantum dot layer material and a distance from the upper surface of the protective layer to an upper surface of the third color quantum dot layer material may each be equal to or less than a preset distance in a thickness direction of the upper substrate.

The preset distance may be a distance from the upper surface of the protective layer to an upper surface of the first partition wall in the thickness direction.

Upper surfaces of the second partition walls may be hydrophobic.

The method may further include forming a reflective plate covering an upper surface of the protective layer and the first partition walls, where the forming of the second partition walls may include forming second partition walls on portions of the reflective plate covering the first partition walls.

The method may further include forming a display element layer above a lower substrate, where the display element layer may include first to third display elements, where the first to third display elements may include a first color emission layer configured to emit light in a first wavelength band, where the second color quantum dot layer may be configured to convert the light in the first wavelength band into light in a second wavelength band, and the third color quantum dot layer may be configured to convert the light in the first wavelength band into light in a third wavelength band.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
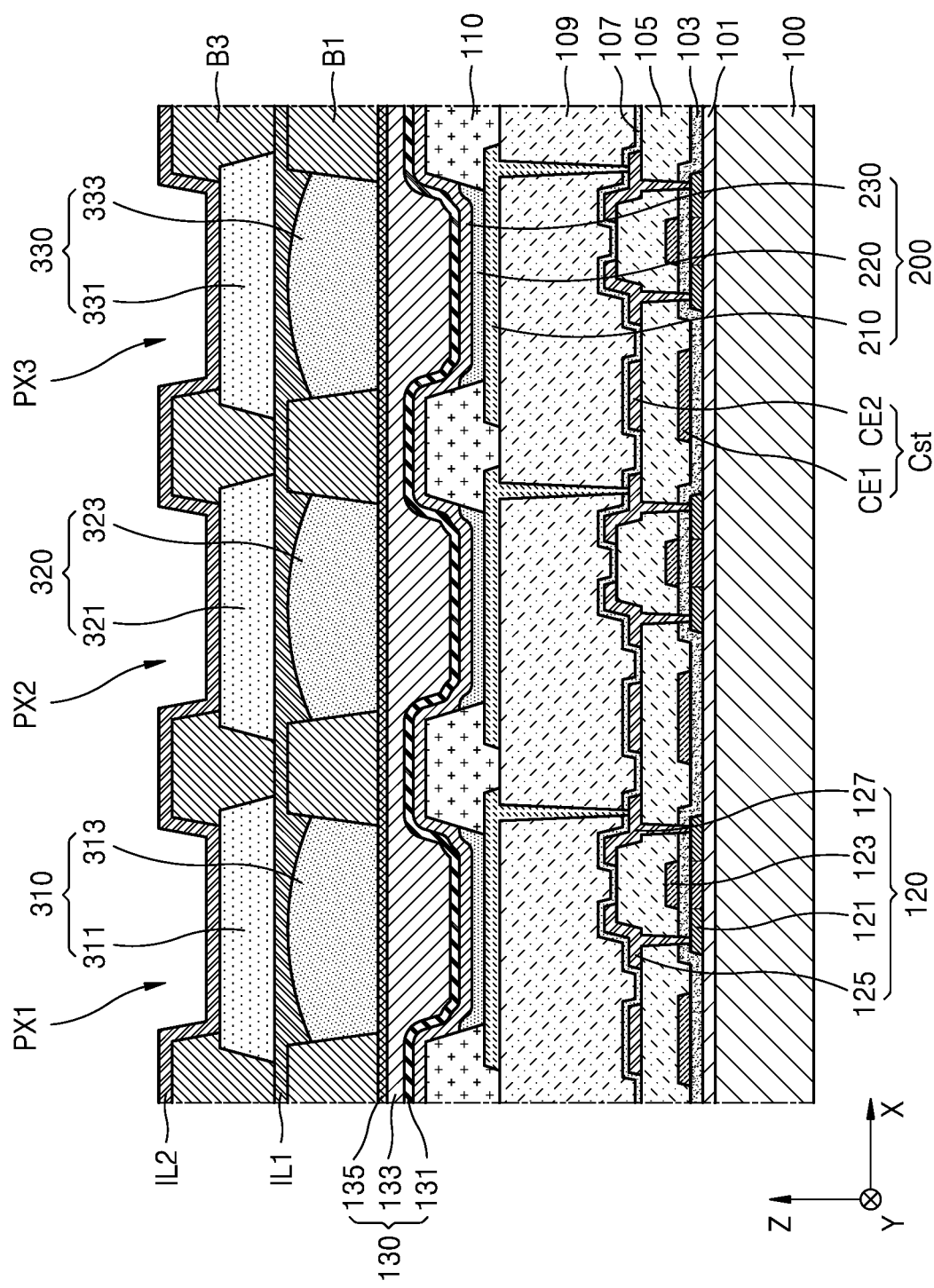
FIG. 1 is a schematic cross-sectional view of a portion of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the present embodiments may have different forms and should not be construed as being limited to the descriptions set forth herein.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

When an embodiment may be implemented differently, a certain process order may be performed differently from the described order. For example, two consecutively described processes may be performed substantially at the same time or performed in an order opposite to the described order.

It will be further understood that, when layers, regions, or components are referred to as being connected to each other, they may be directly connected to each other or indirectly connected to each other with intervening layers, regions, or components therebetween. For example, when layers, regions, or components are referred to as being electrically connected to each other, they may be directly electrically connected to each other or indirectly electrically connected to each other with intervening layers, regions, or components therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

As used herein, the term "pixel" refers to each sub-pixel emitting a different color. For example, each pixel may be one of a red (R) sub-pixel, a green (G) sub-pixel, and a blue (B) sub-pixel.

Although an organic light-emitting display apparatus is described below as an example of a display apparatus according to an embodiment, the display apparatus is not limited thereto. According to some embodiments, the display apparatus may be a display apparatus such as an inorganic light-emitting display apparatus or a quantum dot light-emitting display apparatus. For example, an emission layer of a display element included in the display apparatus may include an organic material, may include an inorganic material, may include quantum dots, may include an organic material and quantum dots, may include an inorganic material and quantum dots, or may include an organic material and an inorganic material and quantum dots.

Hereinafter, embodiments and modifications will be described with reference to the accompanying drawings.

A display apparatus according to one or more embodiments includes a display area where light is emitted and a non-display area where no light is emitted. This may be understood as meaning that a lower substrate 100 includes a display area and a non-display area.

As shown in FIGS. 1 to 22, the display apparatus according to one or more embodiments includes a plurality of pixels in the display area. According to an embodiment, a display apparatus includes first to third pixels PX1 to PX3. However, this is an example, and the display apparatus may include more or fewer pixels in another embodiment. The first to third pixels PX1 to PX3 include first to third display elements, respectively, and there are first to third color regions corresponding to the first to third display elements, respectively. The description that the first to third color regions correspond to the first to third display elements, respectively, means that, in a view in a direction perpendicular to the lower substrate 100 or an upper substrate 400 (i.e., z-axis direction or in a plan view), the first to third color regions overlap the first to third display elements, respectively. Specifically, in a view in a direction perpendicular to the lower substrate 100 or the upper substrate 400 (i.e., the z-axis direction or in the plan view), the first color region may overlap a first pixel electrode of the first display element, the second color region may overlap a second pixel electrode of the second display element, and the third color region may overlap a third pixel electrode of the third display element. As used herein, the z-axis direction corresponds to a thickness direction of the lower substrate 100 or the upper substrate 400.

Although FIGS. 1 to 22 show the first to third pixels PX1 to PX3 adjacent to one another, the disclosure according to the invention is not limited thereto. That is, components such as other wirings may be between the first to third pixels PX1 to PX3. Accordingly, for example, the first pixel PX1 and the second pixel PX2 may not be adjacent pixels. Cross-sections of the first to third pixels PX1 to PX3 in FIGS. 1 to 22 may not be cross-sections in the same direction.

A display apparatus according to an embodiment includes the lower substrate 100. The lower substrate 100 may include a glass material, a metal material, a ceramic material, or a flexible or bendable material. When the lower substrate 100 is flexible or bendable, the lower substrate 100 may include, for example, polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The lower substrate 100 may have a single-layer or multi-layer structure including the above materials. In the case of a multi-layer structure, the lower substrate 100 may be variously modified, for example, to have a multi-layer structure including two layers including polymer resin and a barrier layer including an inorganic material (such as silicon oxide, silicon nitride, silicon oxynitride, etc.) between the two layers.

A buffer layer 101 may be on the lower substrate 100. The buffer layer 101 may include an inorganic material such as silicon oxide, silicon nitride and/or silicon oxynitride and may have a single-layer or multi-layer structure. The buffer layer 101 may increase the smoothness of an upper surface of the lower substrate 100 or may prevent or reduce penetration of impurities or moisture from the outside of the lower substrate 100 into a semiconductor layer 121 of a thin-film transistor 120.

A pixel circuit may be on the buffer layer 101, and a display element layer including a display element 200 electrically connected to the pixel circuit may be above the pixel circuit. The pixel circuit may include the thin-film transistor 120 and a capacitor Cst. The description that the display element 200 is electrically connected to the pixel circuit may mean that a pixel electrode 210 of the display element 200 is electrically connected to the thin-film transistor 120. The display element layer may include the first to third display elements 200 including the first to third pixel electrodes 210.

The thin film transistor 120 may include the semiconductor layer 121 including amorphous silicon, polycrystalline silicon, or an organic semiconductor material, a gate electrode 123, a source electrode 125, and a drain electrode 127.

The semiconductor layer 121 may be on the buffer layer 101 and may include amorphous silicon or polysilicon. For example, the semiconductor layer 121 may include oxide of at least one material selected from the group including indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, the semiconductor layer 121 may be a Zn oxide-based material and may include Zn oxide, In—Zn oxide, Ga—In—Zn oxide, etc. The semiconductor layer 121 may be an In—Ga—Zn—O ("IGZO"), In—Sn—Zn—O ("ITZO"), or In—Ga—Sn—Zn—O ("IGTZO") semiconductor which contains metal, such as indium (In), gallium (Ga), and tin (Sn), in addition to ZnO. The semiconductor layer 121 may include a channel region and a source region and a drain region on both sides of the channel region.

The gate electrode 123 is arranged above the semiconductor layer 121 to overlap at least a part of the semiconductor layer 121. The gate electrode 123 may include various conductive materials including molybdenum (Mo), aluminum (Al), copper (Cu), and/or titanium (Ti) and may have various layered structures. For example, the gate electrode 123 may include a Mo layer and an Al layer or may have a multi-layer structure of Mo/Al/Mo.

The source electrode 125 and the drain electrode 127 may also include various conductive materials including molybdenum (Mo), aluminum (Al), copper (Cu), or titanium (Ti) and have various layered structures. For example, the source electrode 125 and the drain electrode 127 each may include a Ti layer and an Al layer or may have a multi-layer structure of Ti/Al/Ti. The source electrode 125 and the drain electrode 127 may be connected to the source region or the drain region of the semiconductor layer 121 through a contact hole, respectively.

A gate insulating layer 103 may be arranged between the semiconductor layer 121 and the gate electrode 123 to ensure insulation between the semiconductor layer 121 and the gate electrode 123. The gate insulating layer 103 may include an inorganic material such as silicon oxide, silicon nitride and/or silicon oxynitride. A first interlayer-insulating layer 105 may be arranged on the gate electrode 123 as a layer having a predetermined dielectric constant, and the first interlayer-insulating layer 105 may be an insulating layer including an inorganic material such as silicon oxide, silicon nitride and/or silicon oxynitride. The source electrode 125 and the drain electrode 127 may be on the first interlayer-insulating layer 105. The above insulating layer (film) including an inorganic material may be formed through chemical vapor deposition ("CVD") or atomic layer deposition ("ALD"). This may also be applied to the embodiments described later and modifications thereof.

The capacitor Cst may include a first electrode CE1 and a second electrode CE2. The first electrode CE1 and the second electrode CE2 overlap each other with the first interlayer-insulating layer 105 therebetween, and form a capacitance. In this case, the first interlayer-insulating layer 105 serves as a dielectric layer of the capacitor Cst.

The first electrode CE1 may be in the same layer as the gate electrode 123. The first electrode CE1 may include the same material as the gate electrode 123, and for example, may include various conductive materials including molybdenum (Mo), aluminum (Al), copper (Cu), and/or titanium (Ti), and may have various layer structures (for example, a multi-layer structure of Mo/Al/Mo). The second electrode CE2 may be on the same layer as the source electrode 125 and the drain electrode 127. The second electrode CE2 may include the same material as the source electrode 125 and the drain electrode 127, and for example, may include various conductive materials including molybdenum (Mo), aluminum (Al), copper (Cu), and/or titanium (Ti), and may have various layer structures (for example, a multi-layer structure of Ti/Al/Ti).

A planarization layer 109 may be above the thin film transistor 120. When an organic light-emitting device is arranged above the thin film transistor 120 as an example of the display element 200, the planarization layer 109 may substantially planarize an upper portion of the second interlayer-insulating layer 107 covering the thin film transistor 120. The planarization layer 109 may include, for example, a general commercial polymer such as benzocyclobutene ("BCB"), polyimide, hexamethyldisiloxane ("HMDSO"), poly(methyl methacrylate) ("PMMA"), or polystyrene ("PS"), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. Although FIG. 1 shows the planarization layer 109 having a single-layer structure, the planarization layer 109 may have a multi-layer structure in another embodiment, and various modifications may be made.

The display element 200 may be on the planarization layer 109. The display element 200 may be an organic light-emitting device including the pixel electrode 210, an opposite electrode 230, and an intermediate layer 220. The intermediate layer 220 may be disposed between the pixel electrode 210 and an opposite electrode 230 and includes an emission layer.

The pixel electrode 210 of the display element 200 contacts one of the source electrode 125 and the drain electrode 127 through an opening portion (a contact hole) formed in the planarization layer 109, etc. and thus is electrically connected to the thin film transistor 120. The pixel electrode 210 may be a (semi)light-transmissive electrode or a reflective electrode. In some embodiments, the pixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer on the reflective film. The transparent or semi-transparent electrode layer may include at least one selected from the group including indium tin oxide ("ITO"), indium zinc oxide ("IZO"), zinc oxide (ZnO), indium oxide ($In_2O_3$), indium gallium oxide ("IGO"), and aluminum zinc oxide ("AZO"). The pixel electrode 210 may have an ITO/Ag/ITO stack structure.

A pixel-defining layer 110 may be on the planarization layer 109. The pixel-defining layer 110 may define an opening corresponding to each sub-pixel and thus may define a pixel (or an emission area). In this regard, the opening is formed to expose at least a portion of a central portion of the pixel electrode 210. The pixel-defining layer 110 may prevent an arc or the like from occurring at the edge of the pixel electrode 210 by increasing a distance between the edge of the pixel electrode 210 and the opposite electrode 230 arranged above the pixel electrode 210. The pixel-defining layer 110 may include one or more organic insulating materials selected from the group including polyamide, polyimide, acrylic resin, BCB, and phenolic resin and may be formed by a method such as spin coating.

The intermediate layer 220 of the display element 200 may include a low-molecular-weight or polymer material. When the intermediate layer 220 includes the low-molecular-weight material, the intermediate layer 220 may have a structure in which a hole injection layer ("HIL"), a hole transport layer ("HTL"), an emission layer ("EML"), an electron transport layer ("ETL"), an electron injection layer ("EIL"), etc. are stacked in a single or complex structure and may be formed by vacuum deposition. When the intermediate layer 220 includes the polymer material, the intermediate layer 220 may have a structure including an HTL and an EML. In this regard, the HTL may include poly(3,4-ethylenedioxythiophene) ("PEDOT"), and the EML may include a polymer material such as a polyphenylene vinylene ("PPV")-based material, a polyfluorene-based material, etc. The intermediate layer 220 may be formed by screen printing, inkjet printing, deposition, or laser-induced thermal imaging ("LITI"). However, the intermediate layer 220 according to the invention is not limited thereto and may have various structures.

As described above, the intermediate layer 220 may include a monolithic layer over the first pixel electrode of the first display element to the third pixel electrode of the third display element in another embodiment. However, the intermediate layer 220 may include a layer patterned to correspond to each of the first to third pixel electrodes. In any case, the intermediate layer 220 includes a first color emission layer. The first color emission layer may be monolithic over the first to third pixel electrodes, or may be patterned to correspond to each of the first to third pixel electrodes. The first color emission layer may emit light having a wavelength in a first wavelength band, and for example, may emit light having a wavelength of about 450 nanometers (nm) to about 495 nm.

The opposite electrode 230 of the display element 200 is arranged over the display area. As an example, the opposite electrode 230 may include a monolithic layer to cover an entire surface of the display area and may be arranged over the display area. That is, the opposite electrode 230 may be integrally formed in a plurality of display elements 200 to correspond to a plurality of pixel electrodes 210. In this regard, the opposite electrode 230 may cover the display area and extend to a portion of the non-display area outside the display area. As another example, the opposite electrode 230 may be patterned to correspond to each of a plurality of pixel electrodes 210.

The opposite electrode 230 may be a light-transmissive electrode or a reflective electrode. In some embodiments, the opposite electrode 230 may be a transparent or semitransparent electrode and may include a metal thin film having a small work function including lithium (Li), calcium (Ca), lithium fluoride/calcium (LiF/Ca), lithium fluoride/aluminum (LiF/Al), aluminum (Al), silver (Ag), magnesium (Mg), or a compound thereof. In addition to the metal thin film, a transparent conductive oxide ("TCO") film such as ITO, IZO, ZnO, or $In_2O_3$ may be further included.

Such an organic light-emitting device may be easily damaged by external moisture or oxygen and thus may be covered by an encapsulation layer 130 and be protected. The encapsulation layer 130 includes at least one organic encapsulation layer and at least one inorganic encapsulation layer. For example, the encapsulation layer 130 may include a first inorganic encapsulation layer 131, an organic encapsulation layer 133, and a second inorganic encapsulation layer 135.

The first inorganic encapsulation layer 131 may cover the opposite electrode 230 and may include silicon oxide, silicon nitride and/or silicon oxynitride. Other layers (not shown) such as a capping layer may be between the first inorganic encapsulation layer 131 and the opposite electrode 230. Because the first inorganic encapsulation layer 131 is formed along the structure of the opposite electrode 230, an upper surface of the first inorganic encapsulation layer 131 is not flat, and thus, the organic encapsulation layer 133 covers the first inorganic encapsulation layer 131 to have a flat upper surface. The organic encapsulation layer 133 may include one or more materials selected from the group including polyethylene terephthalate, polyethylene naphthalate, polycarbonate, polyimide, polyethylene sulfonate, polyoxymethylene, polyarylate, and HMDSO. The second inorganic encapsulation layer 135 may cover the organic encapsulation layer 133 and may include silicon oxide, silicon nitride, silicon oxynitride, etc.

Even when a crack occurs inside the encapsulation layer 130, the encapsulation layer 130 may prevent the crack from being propagated between the first inorganic encapsulation layer 131 and the organic encapsulation layer 133 or between the organic encapsulation layer 133 and the second inorganic encapsulation layer 135 via the above multi-layer structure. Thus, formation of a path through which external moisture or oxygen may penetrate may be prevented or reduced.

Filter portions, for example, first to third color filter portions 310 to 330, may be above the display element layer. Specifically, the display element layer may include the first to third display elements 200, and in a view (i.e., plan view) in a direction perpendicular to the lower substrate 100 or the upper substrate 400 (i.e., the z-axis direction), the first to third color filter portions 310 to 330 may overlap the first pixel electrode (or an emission layer) of the first display element to the third pixel electrode (or an emission layer of) the third display element, respectively. Accordingly, the first to third color filter portions 310 to 330 may filter light emitted from the first to third display elements, respectively.

First to third display elements 200 of a display apparatus according to one or more embodiments may include first to third pixel electrodes 210 and an opposite electrode 230 corresponding to the first to third pixel electrodes, respectively. The intermediate layer 220 may be between each of the first to third pixel electrodes and the opposite electrode 230 and may include a first color emission layer emitting light having a wavelength in a first wavelength band. In this case, in the first pixel PX1, light of a wavelength in a first wavelength band generated in the intermediate layer 220 is emitted to the outside without wavelength conversion. Accordingly, the first color filter portion 310 in the first pixel PX1 has no quantum dot layer. As described above, because the first pixel PX1 requires no quantum dot layer, a light-transmissive layer 313 including light-transmissive resin may be arranged in the first color region of the first color filter portion 310 instead of a quantum dot layer. The light-transmissive layer 313 may include acryl, BCB, or HMDSO.

Specifically, the first color filter portion 310 includes a first color filter layer 311, the second color filter portion 320 includes a second color filter layer 321 and a second color quantum dot layer 323, and the third color filter portion 330 includes a third color filter layer 331 and a third color quantum dot layer 333.

The first color filter layer 311 may pass only light having a wavelength of about 450 nm to about 495 nm, the second color filter layer 321 may pass only light having a wavelength of about 495 nm to about 570 nm, and the third color filter layer 331 may pass only light having a wavelength of about 630 nm to about 780 nm. The first to third color filter layers 311 to 331 may reduce external light reflection in the display apparatus.

For example, when external light reaches the first color filter layer 311, only the light having a predetermined wavelength as described above passes through the first color filter layer 311, and light of other wavelengths is absorbed by the first color filter layer 311. Accordingly, only the light having a predetermined wavelength as described above from among external light incident on the display apparatus passes through the first color filter layer 311, and a portion of the light that passes through the first color filter layer 311 is reflected by the opposite electrode 230 below or the first pixel electrode 210 of the first display element 200 and is emitted back to the outside. As a result, only a portion of external light incident on where the first pixel PX1 is located is reflected to the outside, and thus, external light reflection may be reduced. This description may also be applied to the second color filter layer 321 and the third color filter layer 331 in the similar manner.

The second color quantum dot layer 323 may convert light of a wavelength in the first wavelength band generated in the intermediate layer 220 of the second display element 200 into light of a wavelength in a second wavelength band. For example, when light having a wavelength of about 450 nm to about 495 nm is generated in the intermediate layer 220 of the second display element, the second color quantum dot layer 323 may convert the light into light having a wavelength of about 495 nm to about 570 nm. Accordingly, in the second pixel PX2, the light having a wavelength of about 495 nm to about 570 nm is emitted to the outside.

The third color quantum dot layer 333 may convert light of a wavelength in the first wavelength band generated in the intermediate layer 220 of the third display element 200 into light of a wavelength in a third wavelength band. For example, when light having a wavelength of about 450 nm to about 495 nm is generated in the intermediate layer 220 of the third display element 200, the third color quantum dot layer 333 may convert the light into light having a wavelength of about 630 nm to about 780 nm. Accordingly, in the third pixel PX3, the light having a wavelength of about 630 nm to about 780 nm is emitted to the outside.

Each of the second color quantum dot layer 323 and the third color quantum dot layer 333 may include quantum dots dispersed in a resin.

A size of the quantum dots may be several nanometers, and a wavelength of light after conversion is changed according to a particle size of the quantum dots. That is, the quantum dots may adjust the color of light to be emitted according to a particle size of the quantum dots, and accordingly, the quantum dots may have various emission colors such as blue, red, and green. A particle size of the quantum dots may have a full width at half maximum ("FWHM") of an emission wavelength spectrum that is equal to or less than about 45 nm or less, specifically equal to or less than about 40 nm or less, and more specifically equal to or less than about 30 nm or less. Color purity or color reproducibility may be improved in this range. Because light emitted through such quantum dots is emitted in all directions, a viewing angle of light with respect to the display apparatus including the quantum dots may improve. A shape of the quantum dots is not particularly limited to a shape generally used in the art, but more specifically may feature a spherical, pyramidal, multi-arm, or cubic nanoparticle, nano-tube, nano-wire, nano-fiber, nano-plate particle shape. The quantum dots may include a semiconductor material such as cadmium sulfide (CdS), cadmium telluride (CdTe), zinc sulfide (ZnS), or indium phosphide (InP).

The resin included in the second color quantum dot layer 323 and the third color quantum dot layer 333 may be a light-transmissive material. For example, polymer resin such as acryl, BCB, or HMDSO may be used to form the second color quantum dot layer 323 and the third color quantum dot layer 333.

In a display apparatus according to the present embodiment, light in a first wavelength band is externally emitted in the first pixel PX1, light in a second wavelength band is externally emitted in the second pixel PX2, and light in a third wavelength band is externally emitted in the third pixel PX3. Accordingly, a display apparatus according to the present embodiment may display a full-color image.

Hereinafter, a method of arranging filter portions, for example, the first to third color filter portions 310 to 330, directly on a display element layer without manufacturing a separate color filter unit (hereinafter, a first embodiment) and a method of manufacturing and bonding a separate color filter unit including filter portions, for example, the first to third color filter portions 310 to 330, to an upper portion of a display element layer (hereinafter, a second embodiment) will be sequentially described as a method of forming filter portions, for example, the first to third color filter portions 310 to 330.

According to the first embodiment (refer to FIGS. 1 to 14), a display apparatus may be formed by arranging filter portions, for example, the first to third color filter portions 310 to 330, directly on the display element layer without manufacturing a separate color filter unit. In this regard, the description 'arranging directly on a display element layer' means arranging, without manufacturing a separate color filter unit, filter portions, for example, the first to third color filter portions 310 to 330, directly on the display element layer to form an integral structure.

In this case, the filter portions, for example, the first to third color filter portions 310 to 330, may be directly arranged on the encapsulation layer 130 arranged on the display element layer. A layer such as an organic layer, an inorganic layer, a conductive layer, or a composite film thereof may be arranged between filter portions (e.g., the first to third color filter portions 310 to 330) and the encapsulation layer 130. An insulating layer IL1 or IL2 may be arranged on a top of filter portions, for example, the first to third color filter portions 310 to 330, or between a color filter layer and a quantum dot layer of filter portions, for example, the first to third color filter portions 310 to 330.

According to the second embodiment (refer to FIGS. 15 to 22), a display apparatus may be manufactured by separately manufacturing a display unit including a display element layer and a color filter unit including filter portions, for example, the first to third color filter portions 310 to 330, and then by bonding the color filter unit to an upper portion of the display unit. That is, the display apparatus may include a display unit and a color filter unit arranged opposite to the display unit.

The display unit may include the first to third pixels PX1 to PX3 arranged over the lower substrate 100. The first to third pixels PX1 to PX3 may include first to third display elements, respectively. The first to third display elements arranged in the first to third pixels PX1 to PX3 each may include an emission layer that generates first color (for example, blue) light.

The color filter unit may be manufactured by preparing the upper substrate 400 and forming filter portions, for example, the first to third color filter portions 310 to 330, on a first surface (i.e., a surface facing the display unit when the display unit and the color filter unit are bonded together) of the upper substrate 400. A detailed description of a process of manufacturing the color filter unit will be given below with reference to FIGS. 15 to 22.

Hereinafter, a process of manufacturing a display apparatus according to the first embodiment and its modification will be described with reference to FIGS. 1 to 14, and a process of manufacturing a display apparatus according to the second embodiment and its modification will be described with reference to FIGS. 15 to 22. However, repeated descriptions are omitted.

Although a display element, a filter portion, a color filter layer, a light-transmissive layer, or a quantum dot layer arranged in a certain pixel is described for convenience, the same may apply to a display element, a filter portion, a color filter layer, a light-transmissive layer, or a quantum dot layer arranged in another pixel. For example, a description of a first color filter layer may also be applied to a second color filter layer and a third color filter layer, and a description of a second color quantum dot layer may also be applied to a third color quantum dot layer.

FIG. 1 is a schematic cross-sectional view of a portion of a display apparatus according to an embodiment (the first embodiment). FIGS. 2 to 10 are schematic cross-sectional views of a process of manufacturing a portion of the display apparatus of FIG. 1. Specifically, FIGS. 2 to 10 are schematic cross-sectional views of a process of forming a display element layer including first to third display elements above the lower substrate 100 and then manufacturing the encapsulation layer 130, color filter layers, for example, the first to third color filter layers 311 to 331, and quantum dot layers, for example, the second and third color quantum dot layers 323 and 333, on the display element layer.

Figure 2:
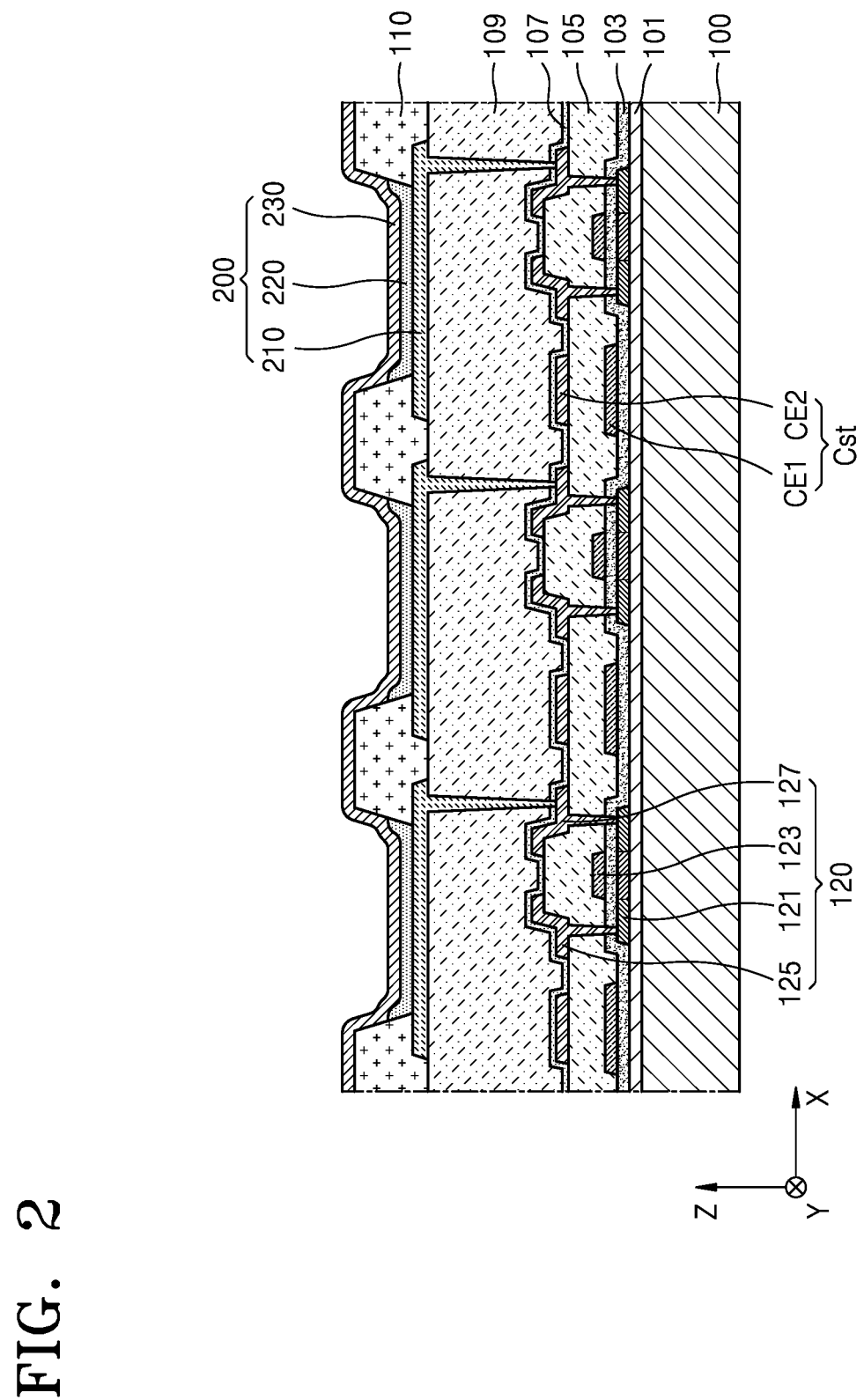
FIGS. 2 to 10 are schematic cross-sectional views of a process of manufacturing a portion of the display apparatus of FIG. 1.
Figure 3:
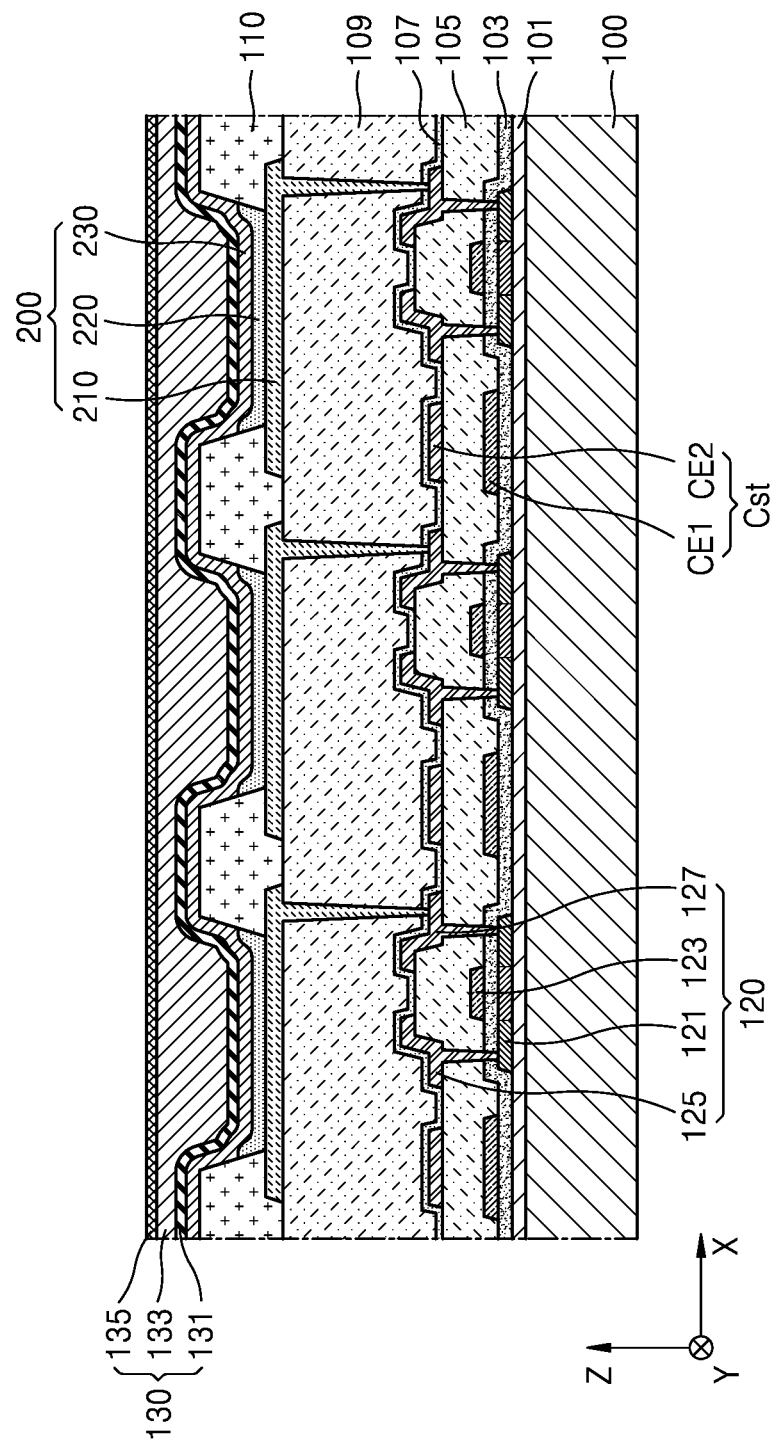

As shown in FIGS. 2 and 3, a display element layer including first to third display elements 200 is formed above the lower substrate 100, and the encapsulation layer 130 is formed on the display element layer.

The encapsulation layer 130 may include the first inorganic encapsulation layer 131, the organic encapsulation layer 133, and the second inorganic encapsulation layer 135. As the organic encapsulation layer 133 is arranged between the first inorganic encapsulation layer 131 and the second inorganic encapsulation layer 135, an upper surface of the encapsulation layer 130 (i.e., an upper surface of the second inorganic encapsulation layer 135) may be flat.

Figure 4:
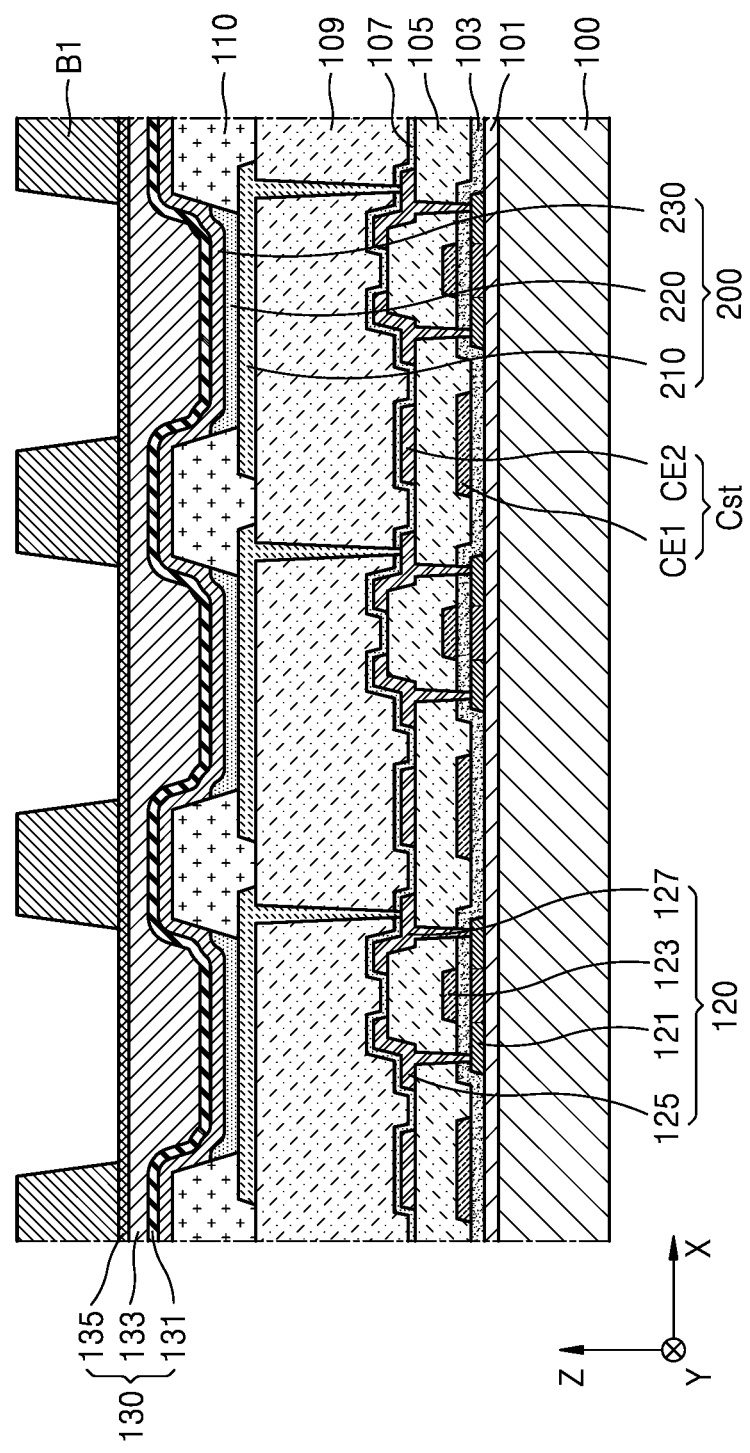

Next, as shown in FIG. 4, first partition walls B1 are formed on the encapsulation layer 130. The first partition walls B1 may be separated from each other on the encapsulation layer 130, and in a view (i.e., plan view) in a direction perpendicular to the lower substrate 100 (i.e., the z-axis direction), may define first to third color regions overlapping the first to third display elements 200, respectively. That is, the first partition walls B1 define first to third color regions in regions (hereinafter, "separation regions") between adjacent first partition walls B1, and the first to third color regions correspond to the first to third display elements in a direction perpendicular to the lower substrate 100, respectively. Specifically, the first to third color regions correspond to emission areas of the first to third pixels PX1 to PX3, respectively.

Figure 6:
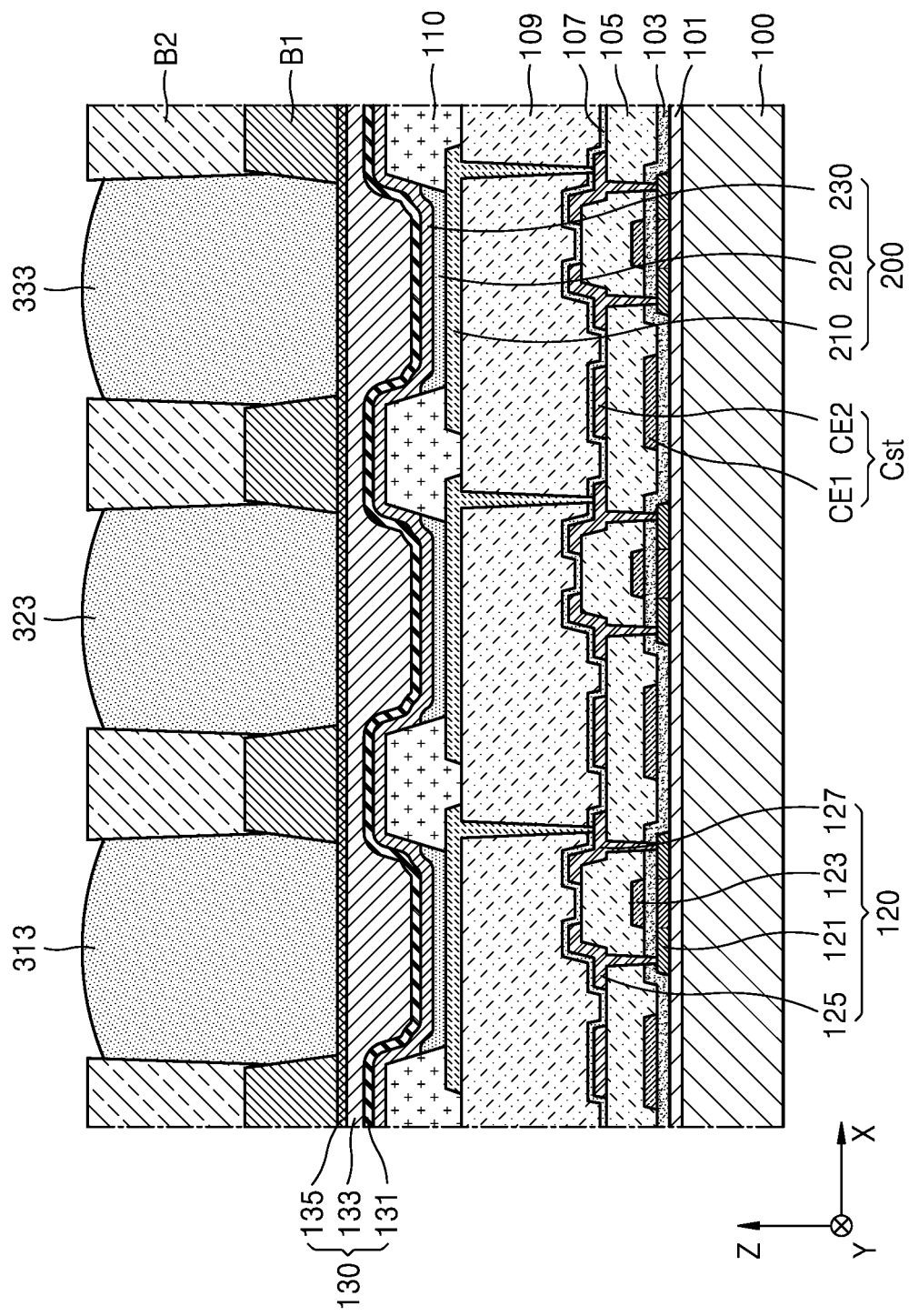

The light-transmissive layer 313, the second color quantum dot layer 323, or the third color quantum dot layer 333 may be arranged in the first to third color regions, respectively (See FIG. 6). In this regard, a height (i.e., length in the z-axis direction) of the first partition walls B1 may be determined according to a height at which the light-transmissive layer 313, the second color quantum dot layer 323, or the third color quantum dot layer 333 will be finally formed in the first to third color regions. For example, the first partition walls B1 may be formed so that a distance from the upper surface of the encapsulation layer 130 to an upper surface of the first partition wall B1 in the z-axis direction is equal to or greater than each of a distance from the upper surface of the encapsulation layer 130 to an upper surface of the second color quantum dot layer 323 finally formed and a distance from the upper surface of the encapsulation layer 130 to an upper surface of the third color quantum dot layer 333 finally formed.

The first partition walls B1 may be patterned into a non-emission area to serve as a light-blocking layer. That is, light may be emitted to the outside only through the first to third color regions, which are the separation regions above the display element layer in which the first partition walls B1 are not located.

The first partition walls B1 may include a material (e.g., photoresist) that causes a chemical change when irradiated with light. For example, the first partition walls B1 may include aromatic bis-azide, methacrylic acid ester, cinnamic acid ester, etc. as negative photoresists and/or may include PMMA, naphthoquinone diazide, polybutene-1-sulfone, etc. as positive photoresists. However, the invention is not limited to the above-described examples. In an optional embodiment, the first partition walls B1 may include a black matrix, a black pigment, a metal material, etc. to serve as a light-blocking layer and may include a reflective material such as Al, Ag, etc. to increase light efficiency.

Figure 5:
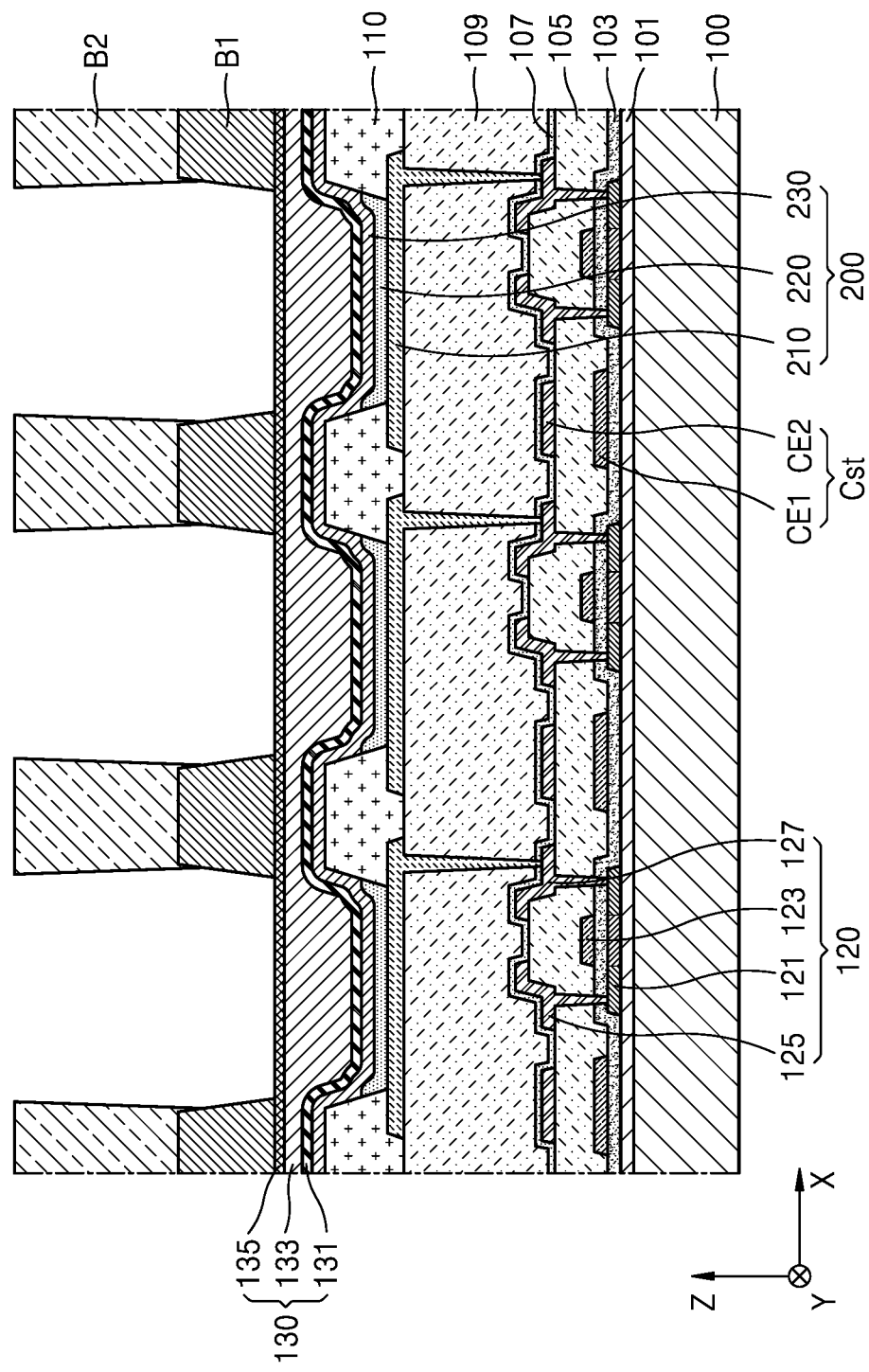

Next, as shown in FIG. 5, second partition walls B2 are formed on the first partition walls B1. The second partition walls B2 prevent materials injected into the first to third color regions, which are separation regions (i.e., the regions separating the first partition walls B1) of the first partition walls B1, from overflowing to an adjacent region at a time of injection or being mixed with a material injected into an adjacent region. A height of the second partition walls B2 in the z-axis direction may be determined according to a maximum height of a material injected at a time of injection of a material injected into the first to third color regions. For example, the second partition walls B2 may be formed so that a distance from the upper surface of the encapsulation layer 130 to the upper surface of the second partition wall B2 in the z-axis direction is equal to or greater than a maximum distance from the upper surface of the encapsulation layer 130 to an upper surface of a light-transmissive layer material, a second color quantum dot layer material (i.e., a material filled in the second color region), or a third color quantum dot layer material (i.e., a material filled in the third color region).

The second partition walls B2 may include the same material as the first partition walls B1. For example, the second partition walls B2 may include aromatic bis-azide, methacrylic acid ester, cinnamic acid ester, etc. as negative photoresists and/or may include PMMA, naphthoquinone diazide, polybutene-1-sulfone, etc. as positive photoresists.

In another embodiment, the second partition walls B2 may include a different material from the first partition walls B1. For example, an upper surface of the second partition walls B2 may be hydrophobic. That is, an upper surface of the second partition walls B2 may be subject to hydrophobic surface treatment. The hydrophobic surface treatment may include various methods such as a method of assigning hydrophobicity to a material and a method of using hydrophobic coating. Examples of the various methods include a chemical method using a material having low surface energy (for example, fluorine), a structural method for reducing a contact surface between a liquid and a material by forming roughness on the surface through a nanocomposite structure, and a coating method using a coating material (for example, a manganese oxide polystyrene (MnO2/PS) nanocomposite material, a zinc oxide polystyrene (ZnO/PS) nanocomposite material, precipitated calcium carbonate, a carbon nanotube structure, silica nano-paint, etc.). However, the invention is not limited to the above-described examples.

As described above, as an upper surface of the second partition walls B2 is hydrophobically treated, the upper surface of the second partition walls B2 and an inner surface of the second partition walls B2 may have a differential level of hydrophobicity, and accordingly, a material injected into the first to third color regions may be convex toward the upper surface of the second partition walls B2. Thus, a phenomenon in which materials injected into the first to third color regions, respectively, are mixed by invading adjacent regions may be prevented.

Instead of hydrophobically treating only an upper surface of the second partition walls B2, upper and inner surfaces of the second partition walls B2 may be subject to hydrophobic surface treatment at a differential level in another embodiment. For example, hydrophobicity of the upper surface of the second partition walls B2 may be higher than hydrophobicity of the inner surface of the second partition walls B2. As a method of performing hydrophobic surface treatment at a differential level, a method of varying the number of fluorine atoms per unit area provided on the upper and inner surfaces of the second partition walls B2 may be used, but the disclosure according to the invention is not limited to the above-described example.

Figure 7:
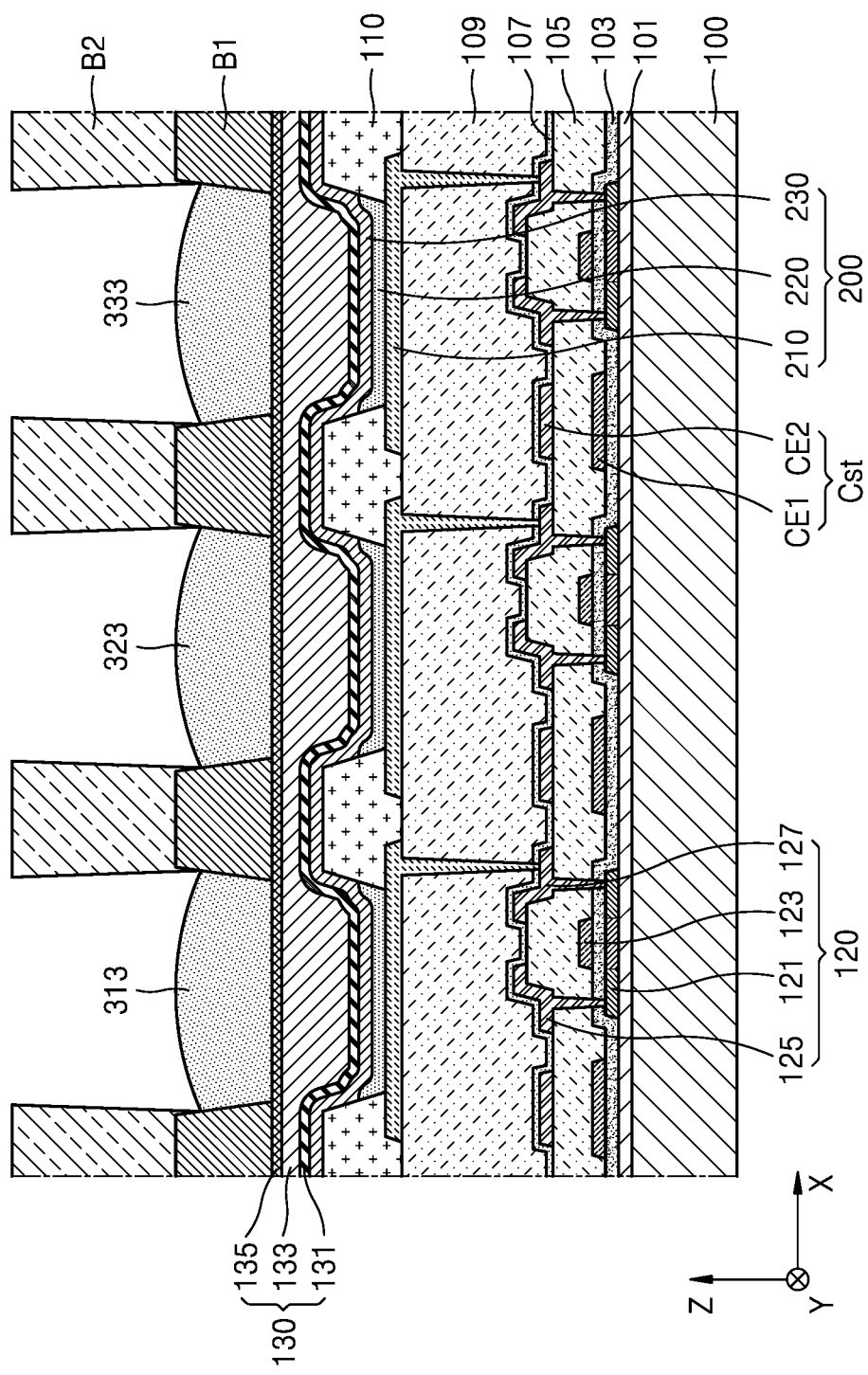
Figure 8:
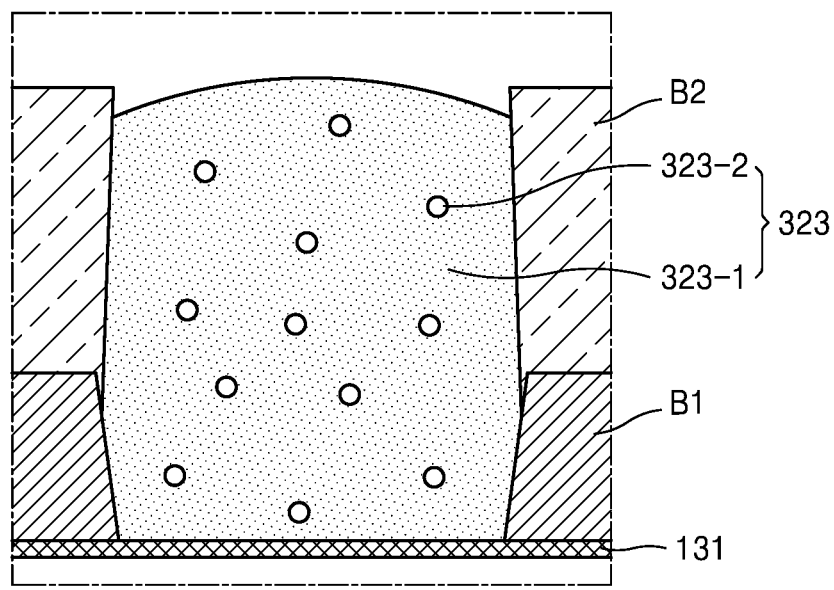
Figure 8:
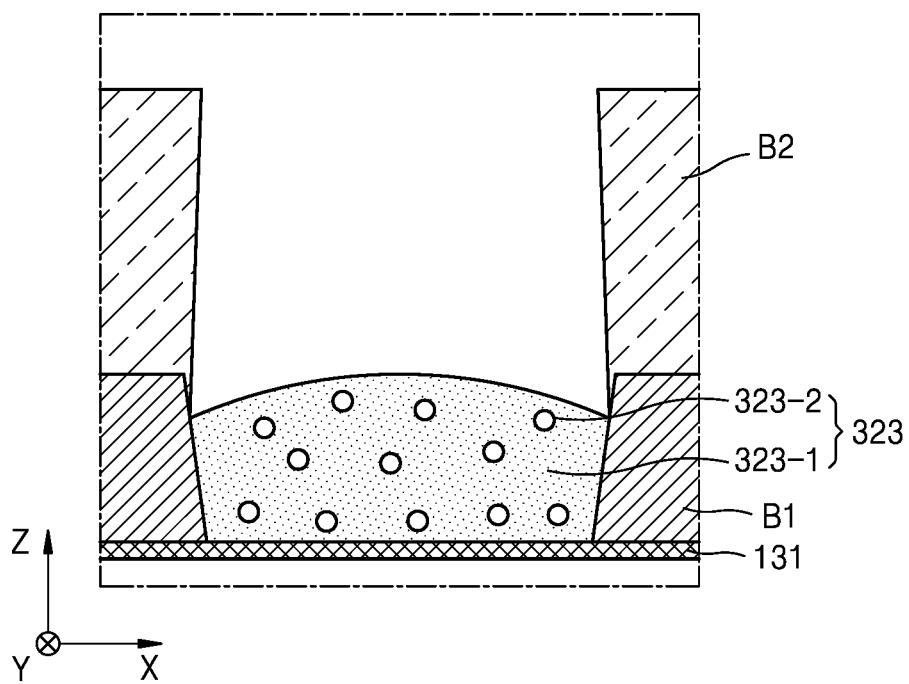

Next, as shown in FIGS. 6 to 8, a quantum dot layer is formed in the second color region and the third color region. Specifically, the second color quantum dot layer 323 is formed in the second color region, and the third color quantum dot layer 333 is formed in the third color region. During an operation of forming such a quantum dot layer, the light-transmissive layer 313 instead of a quantum dot layer may be formed in the first color region. A method of forming a quantum dot layer may use an inkjet printing process but is not limited thereto.

The operation of forming a quantum dot layer may include an operation of injecting a second color quantum dot layer material into the second color region and injecting a third color quantum dot layer material into the third color region, an operation of volatilizing a portion of a material included in the second color quantum dot layer material and a portion of a material included in the third color quantum dot layer material, and an operation of curing the second color quantum dot layer material and the third color quantum dot layer material. That is, in a method of manufacturing a display apparatus, according to the present embodiment, by injecting quantum dot layer materials to a height exceeding a preset final formation height (a preset height in the z-axis direction) of quantum dot layers (for example, the second and third color quantum dot layers 323 and 333), and volatilizing and then curing the injected quantum dot layer materials until a height of the injected quantum dot layer materials reduced to the preset height, quantum dot layers, for example, the second and third color quantum dot layers 323 and 333, may be formed at the preset height.

Specifically, a portion of a material included in the second color quantum dot layer material and a portion of a material included in the third color quantum dot layer material are volatilized such that a distance from the upper surface of the encapsulation layer 130 to an upper surface of the second color quantum dot layer material and a distance from the upper surface of the encapsulation layer 130 to an upper surface of the third color quantum dot layer material each are equal to or less than a preset distance in the z-axis direction. That is, a height of the top of a final quantum dot layer may be adjusted to be the preset height by controlling conditions (for example, time, temperature, humidity, etc.) for volatilizing the quantum dot layer materials.

In this regard, the preset distance may be a distance from the upper surface of the encapsulation layer 130 to the upper surfaces of the first partition walls B1 in the z-axis direction. In this case, a height of the second color quantum dot layer 322 and the third color quantum dot layer 333 in the z-axis direction each are equal to or less than a height of the first partition walls B1 in the z-axis direction.

Volatilization of the quantum dot layer materials means volatilization of a portion of a material other than quantum dots in the quantum dot layer materials. Specifically, during the volatilizing operation, a portion of a material other than quantum dots in the second color quantum dot layer material and a portion of a material other than quantum dots in the third color quantum dot layer material are volatilized. In this regard, the 'material other than quantum dots' may include monomers included in the quantum dot layer material. Residual monomers which are not volatilized may be present in the form of a polymer in the quantum dot layer after the curing operation. For example, the material other than quantum dots in the quantum dot layer materials may include monomers constituting polymer resin, such as acryl, BCB, or HMDSO, as a light-transmissive material.

As described above, by volatilizing a portion of the material other than quantum dots in the second color quantum dot layer material and a portion of the material other than quantum dots in the third color quantum dot layer material, a height of the quantum dot layers 323 and 333 may decrease, and a concentration of quantum dots included in the quantum dot layer material may be significantly increased.

FIG. 8 is schematic cross-sectional views of before and after a portion of a material included in the second color quantum dot layer material (or the third color quantum dot layer material) injected into the second color region (or the third color region) is volatilized. As shown in FIG. 8, the quantum dot layer material (the second color quantum dot layer material or the third color quantum dot layer material) may include quantum dots 323-2 and a material 323-1 other than quantum dots. During an operation of volatilizing a portion of a material included in the quantum dot layer material (i.e., the second color quantum dot layer material or the third color quantum dot layer material), the material 323-1 other than quantum dots is volatilized, and the quantum dots 323-2 are not volatilized and the amount of the quantum dots 323-2 is maintained. Accordingly, as the material 323-1 other than quantum dots is volatilized, a height at which the quantum dot layer finally decreases, whereas a concentration of the quantum dots 323-2 included in the quantum dot layer material (i.e., the second color quantum dot layer material or the third color quantum dot layer material) increases.

In the related art, in forming a quantum dot layer through an inkjet process, an amount of quantum dot layer material to be injected has to be increased without increasing a concentration of quantum dots included in a quantum dot layer material to maintain viscosity at a predetermined level or below. Due to this, the quantum dot layer and partition walls are formed excessively high, and thus, light emitted at a great angle with respect to the z-axis direction among light emitted from the quantum dot layer is absorbed by the partition walls, thereby reducing efficiency or causing vulnerability to physical damage (for example, breaking of the partition walls) to the partition walls. In contrast, according to one or more embodiments of the invention, a relatively low concentration of quantum dot layer material may be injected at a time of injection, and as the injected quantum dot layer material is volatilized, a concentration of quantum dots may increase to a higher concentration compared to the time of injection while a final formation height of a quantum dot layer reduces. Accordingly, it is easy to make a quantum dot layer material satisfy a predetermined level of viscosity at a time of injection, and by reducing heights of a quantum dot layer and a partition wall finally formed, the emission efficiency of the quantum dot layer may increase, and defects due to physical damage to the partition walls may decrease.

A portion of a material included in the quantum dot layer material (i.e., the second color quantum dot layer material or the third color quantum dot layer material) may be volatilized by thermal energy. That is, a portion of a material included in the quantum dot layer material (i.e., the second color quantum dot layer material or the third color quantum dot layer material) may be volatilized by providing thermal energy to the quantum dot layer (i.e., the second quantum dot layer or the third quantum dot layer). As an example of a method of providing thermal energy, a vacuum dry ("VCD") process, a baking process, etc. may be used, but the disclosure according to the invention is not limited thereto. To prevent other layers (for example, an organic emission layer, etc. included in the display element layer) from being damaged by thermal energy, thermal energy may be provided while maintaining satisfying the condition of a predetermined temperature or below.

Figure 9:
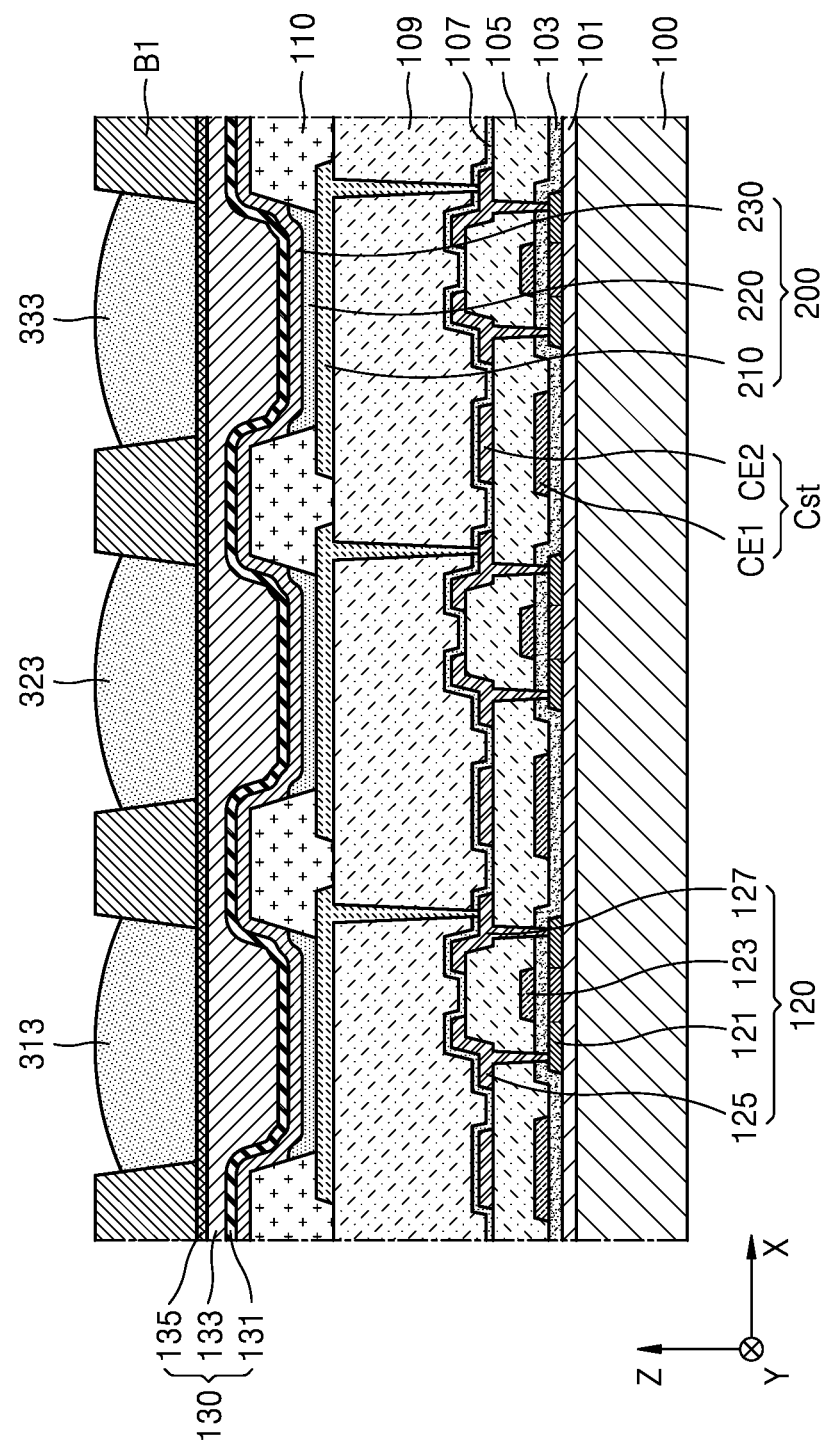

Next, as shown in FIG. 9, the second partition walls B2 are removed. The second partition walls B2 are for preventing the quantum dot layer material (the second color quantum dot layer material or the third color quantum dot layer material) from flowing to an adjacent region at a time of injection and thus are removed when the quantum dot layers are finally formed through the volatilization and curing operations. Accordingly, a height of the final quantum dot layer may decrease. The second partition walls B2 may include, for example, a photoresist material, and thus, the second partition walls B2 may be removed through a lift-off process that removes the photoresist material. However, the disclosure according to the invention is not limited thereto, and the second partition walls B2 including various materials may be removed by various methods such as etching in another embodiment.

Figure 10:
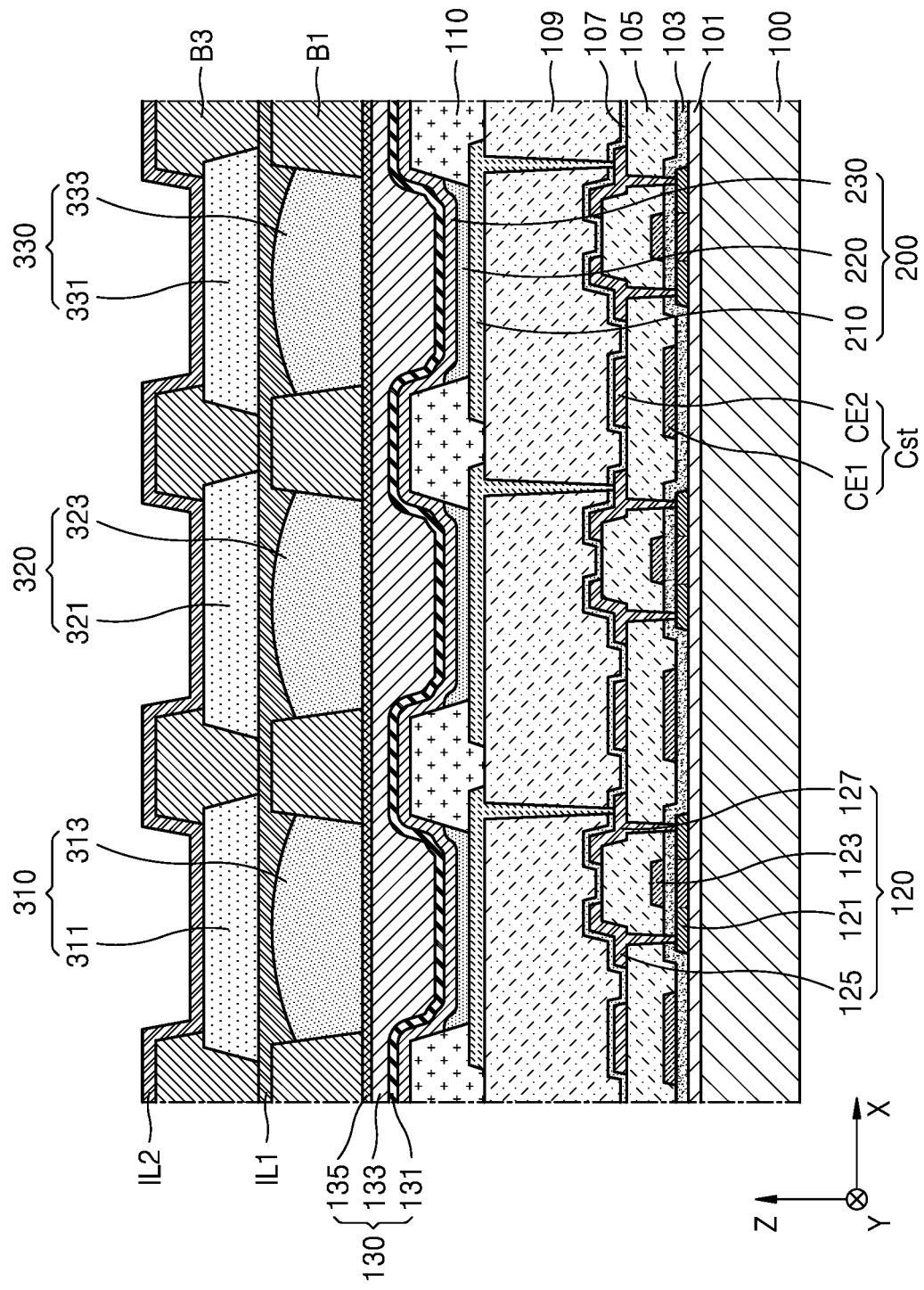

Next, as shown in FIG. 10, after the second partition walls B2 are removed, color filter layers, for example, the first to third color filter layers 311 to 331, are formed above the light-transmissive layer 313, the second color quantum dot layer 323, and the third color quantum dot layer 333.

A first insulating layer IL1 may be disposed on the light-transmissive layer 313, the second color quantum dot layer 323, and the third color quantum dot layer 333. The first insulating layer IL1 may include a light-transmissive inorganic insulating material. For example, the first insulating layer IL1 may include a material such as silicon oxide, silicon nitride, or silicon oxynitride.

It is desirable to prevent the second color quantum dot layer 323 and the third color quantum dot layer 333 from being damaged during a manufacturing process or a usage after manufacturing. For example, it is necessary to prevent outgas generated in the second color filter layer 321 from damaging quantum dots in the second color quantum dot layer 323 and causing the quantum dots to fail to convert light in a first wavelength band into light in a second wavelength band. Likewise, it is desirable to prevent outgas generated in the third color filter layer 331 from damaging quantum dots in the third color quantum dot layer 333 and from causing the quantum dots to fail to convert light in a first wavelength band into light in a third wavelength band. To this end, the first insulating layer IL1 may be arranged between the second color filter layer 321 and the second color quantum dot layer 323 and may also be arranged between the third color filter layer 331 and the third color quantum dot layer 333. The first insulating layer IL1 may include an inorganic material layer such as silicon oxide, silicon nitride, or silicon oxynitride to prevent gas passage. The first insulating layer IL1 may include an organic material layer including one or more materials selected from the group including polyethylene terephthalate, polyethylene naphthalate, polycarbonate, polyimide, polyethylene sulfonate, polyoxymethylene, polyarylate, and HMDSO. The first insulating layer IL1 may be integrally formed to cover all the light-transmissive layer 313, the second color quantum dot layer 323, and the third color quantum dot layer 333.

Third partition walls B3 may be arranged on the first insulating layer IL1 to correspond to the first partition walls B1. That is, the third partition walls B3 are arranged above the first partition walls B1 to overlap the first partition walls B1 in a view (i.e., plan view) in a direction (i.e., the z-axis direction) perpendicular to the lower substrate 100. Color filter layers, for example, the first to third color filter layers 311 to 331, are formed in separation regions between the third partition walls B3.

A second insulating layer IL2 may be formed on the color filter layers, for example, the first to third color filter layers 311 to 331, to cover the third partition walls B3 and the color filter layers, for example, the first to third color filter layers 311 to 331. The second insulating layer IL2 may include the same material as the first insulating layer IL1, and for example, may include a material, such as silicon oxide, silicon nitride, or silicon oxynitride, as a light-transmissive inorganic insulating material.

Figure 11:
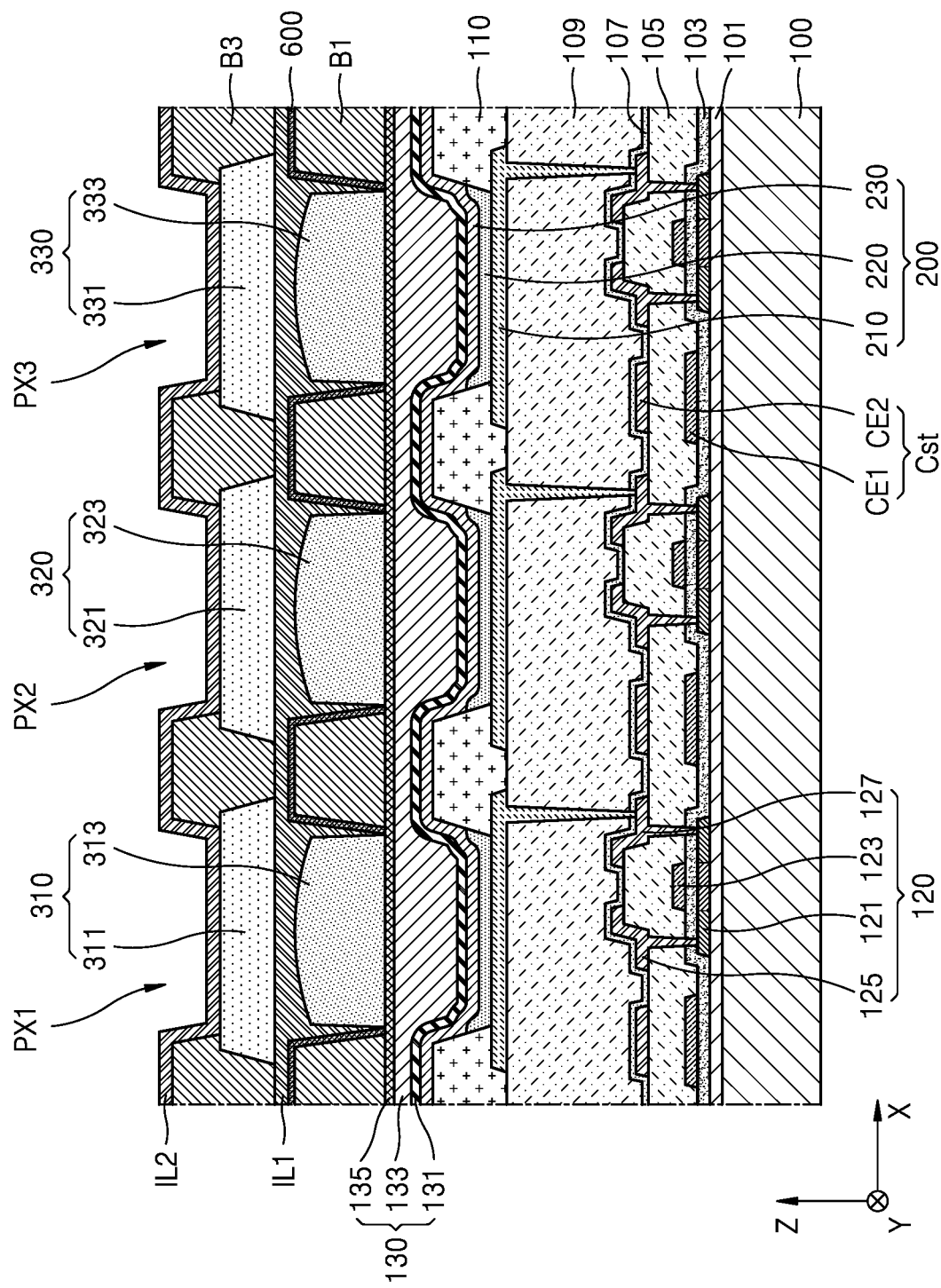
FIG. 11 is a schematic cross-sectional view of a portion of a modified example of the display apparatus of FIG. 1.
Figure 12:
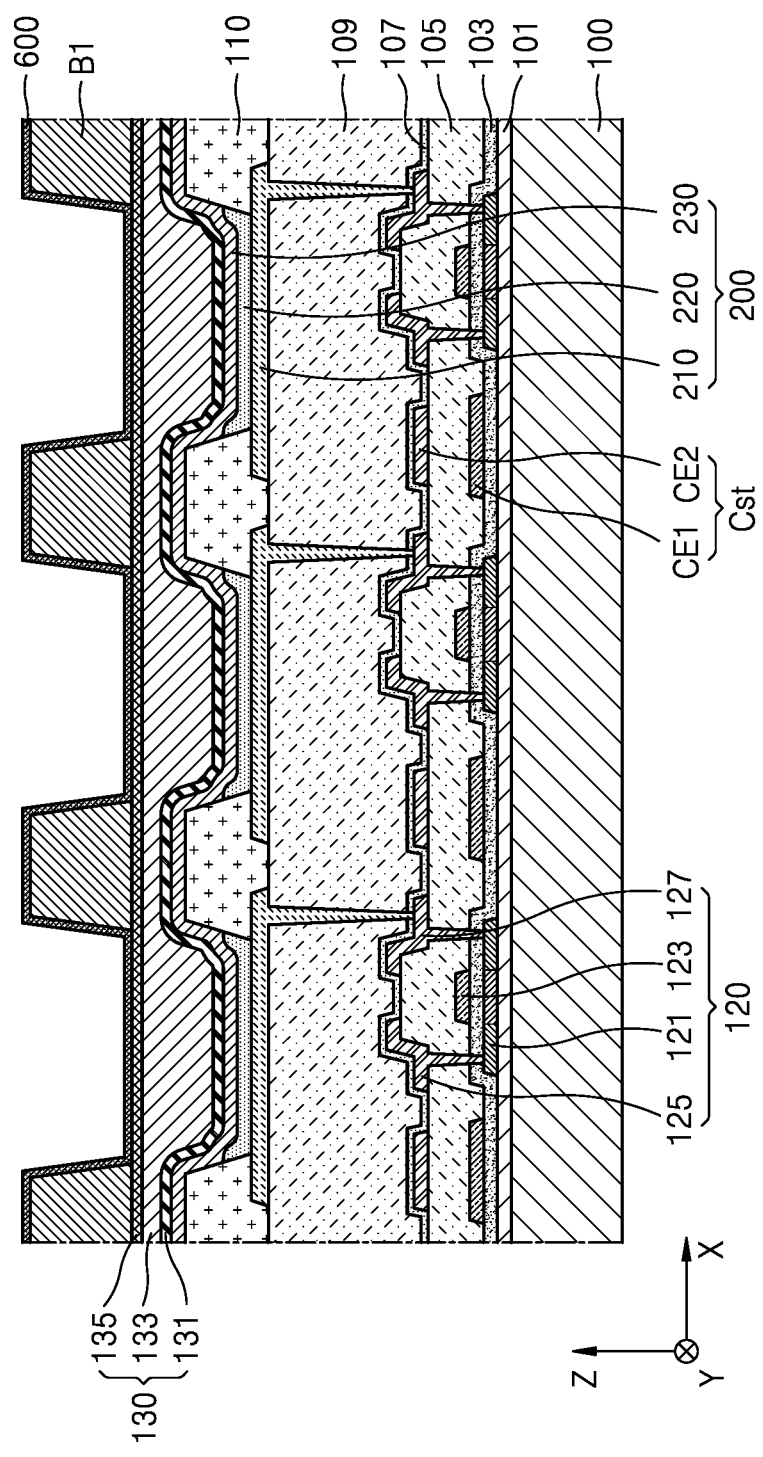
FIGS. 12 to 14 are schematic cross-sectional views of a portion of a process of manufacturing a portion of the display apparatus of FIG. 11.
Figure 13:
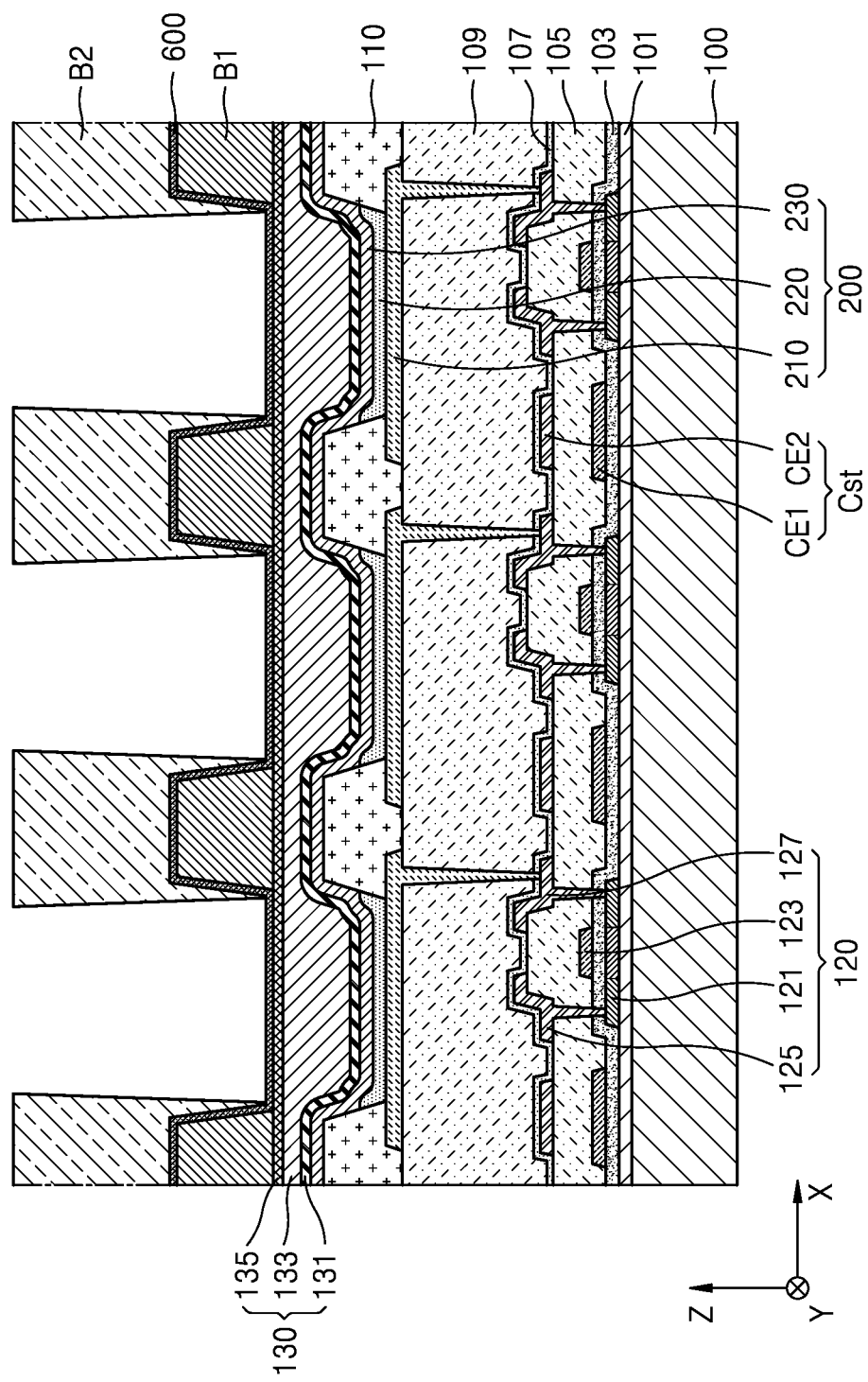
Figure 14:
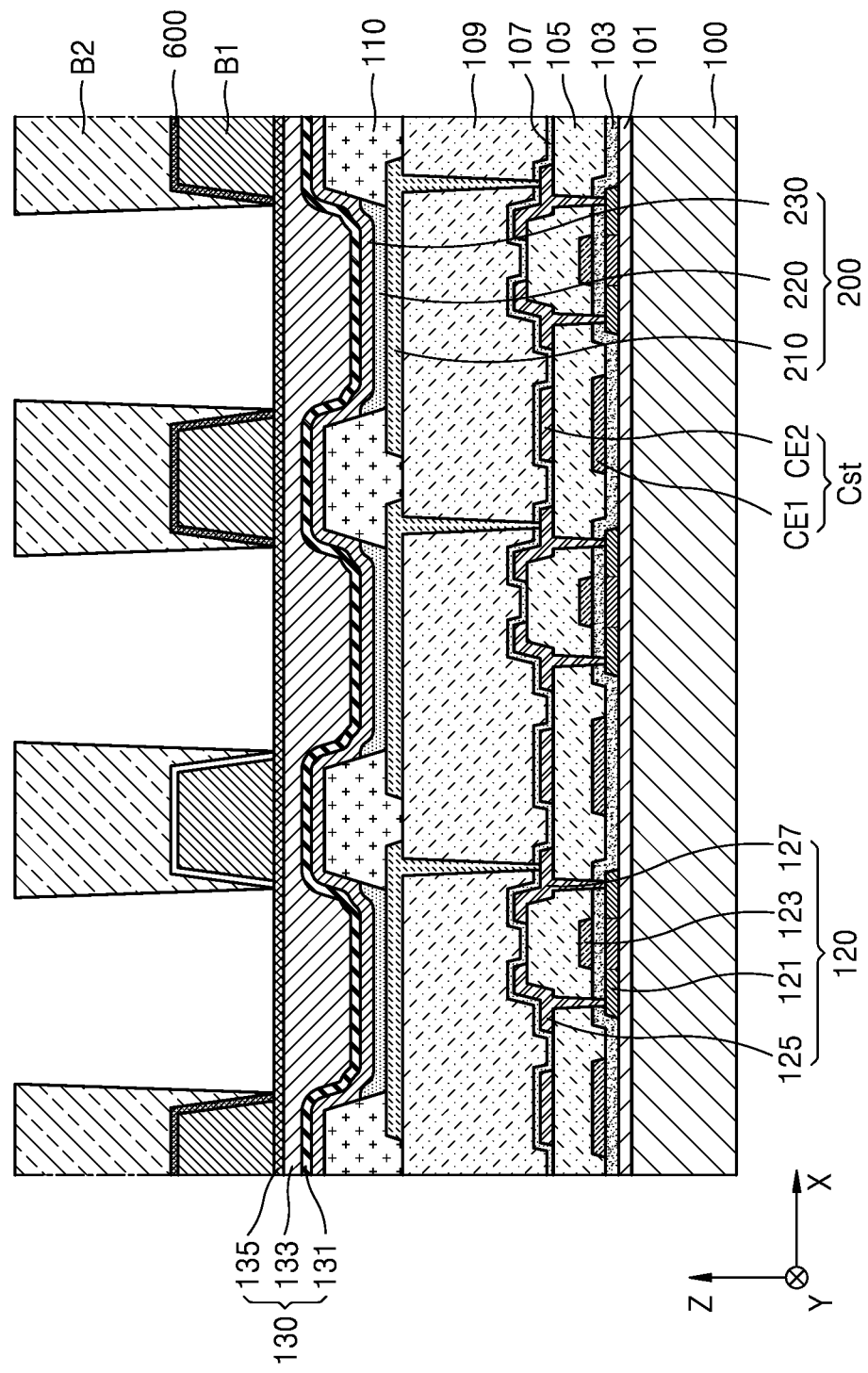

FIG. 11 is a schematic cross-sectional view of a portion of a modified example of the display apparatus of FIG. 1 (a modified example of the first embodiment). FIGS. 12 to 14 are schematic cross-sectional views of a portion of a process of manufacturing a portion of the display apparatus of FIG. 11.

As shown in FIG. 11, a display apparatus according to the present modified example may further include a reflective plate 600 covering the first partition walls B1.

The reflective plate 600 may improve the emission efficiency of quantum dot layers (for example, the second and third color quantum dot layers 323 and 333) by preventing a portion of light emitted from the quantum dot layers (for example, the second and third color quantum dot layers 323 and 333), from being absorbed by the first partition walls B1 and reflecting the portion of light. The reflective plate 600 may include a reflective metal material, and for example, may include metal such as Al or Ag.

Hereinafter, a process of manufacturing a display apparatus according to a modified example of the first embodiment will be described with reference to FIGS. 12 to 14. Differences from a process of manufacturing a display apparatus according to the first embodiment will be mainly described, and redundant descriptions are omitted.

As shown in FIG. 12, the reflective plate 600 is formed to cover an upper surface of the encapsulation layer 130 and the first partition walls B1 formed on the encapsulation layer 130.

Next, as shown in FIG. 13, the second partition walls B2 are formed on the reflective plate 600. That is, in a process of manufacturing a display apparatus according to the present modified example, an operation of forming the second partition walls B2 is an operation of forming the second partition walls B2 on portions of the reflective plate 600 covering the first partition walls B1.

Next, as shown in FIG. 14, the reflective plate 600 on portions that do not cover the first partition walls B1 is removed. Thus, the reflective plate 600 remains only in a portion covering the first partition walls B1 and is removed from emission regions between the first partition walls B1 to allow light generated from an emission layer arranged below the reflective plate 600 to normally (i.e., z-axis direction) reach the light-transmissive layer 313, quantum dot layers, for example, the second and third color quantum dot layers 323 and 333, and color filter layers, for example, the first to third color filter layers 311 to 331, in the emission regions.

Although a dry etching process, a wet etching process, etc. using a photoresist may be used to remove the reflective plate 600 on portions that do not cover the first partition walls B1, the disclosure according to the invention is not limited to the above-described examples, and any patterning process may be applied.

Subsequently, the same process as the manufacturing process of the first embodiment (refer to FIGS. 6 to 10) may be performed to manufacture a display apparatus according to the present modified example.

Figure 15:
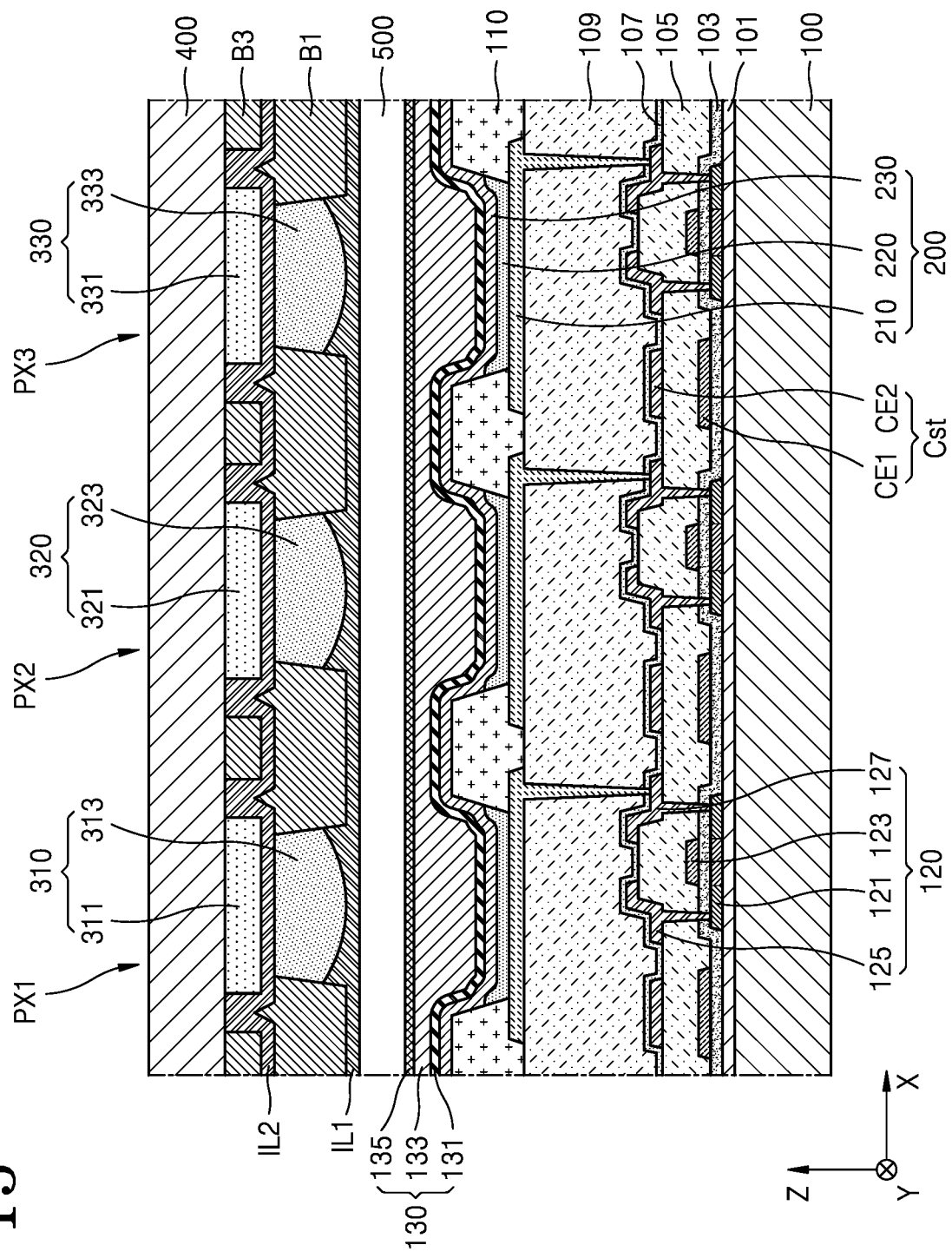
FIG. 15 is a schematic cross-sectional view of a portion of a display apparatus according to another embodiment.

FIG. 15 is a schematic cross-sectional view of a portion of a display apparatus according to another embodiment (the second embodiment). FIGS. 16 to 21 are schematic cross-sectional views of a process of manufacturing a portion of the display apparatus of FIG. 15.

The descriptions of the first embodiment may also be applied to the second embodiment, and differences between the first and second embodiments are mainly described, and redundant descriptions are omitted.

Referring to FIG. 15, although a structure below the encapsulation layer 130 is the same as that of FIG. 1 described above, there is a difference in that a color filter unit is separately manufactured and bonded to an upper portion of the encapsulation layer 130. Hereinafter, a structure of a filter unit, which is separately manufactured and bonded to an upper portion of the encapsulation layer 130, will be mainly described, and redundant descriptions are omitted.

Referring to FIG. 15, components of a color filter unit are arranged on a first surface of the upper substrate 400. In this regard, the 'first surface' refers to a surface facing the lower substrate 100 (in a −z-axis direction) when the upper substrate 400 is arranged above the lower substrate 100. In the following description of FIG. 15, the components are described as being arranged on the first surface of the upper substrate 400, but the color filter unit is substantially arranged upside down such that the upper substrate 400 is disposed at the top as shown in FIG. 15. Hereinafter, a process of manufacturing the color filter unit is described with reference to FIGS. 16 to 21. Accordingly, in the descriptions of FIGS. 15 to 21, the description that the components are arranged on the 'first surface' may be understood as meaning that, when the color filter unit is arranged for bonding with a display unit, the components are arranged below a surface facing the display unit (in the −z-axis direction). For example, when a 'layer B' is referred to as being arranged on a 'layer A', the 'layer B' may be substantially arranged under the 'layer A' with reference to FIG. 15 in a display apparatus according to the present embodiment.

As shown in FIG. 15, the color filter unit includes the upper substrate 400. The upper substrate 400 is disposed above the lower substrate 100, and thus, a display element layer is arranged between the upper substrate 400 and the lower substrate 100. Like the lower substrate 100, the upper substrate 400 may include glass, transparent metal, or polymer resin.

Filter portions, for example, the first to third color filter portions 310 to 330, are on the upper substrate 400. The color filter unit is bonded to a display unit including the display element layer such that the filter portions, for example, the first to third color filter portions 310 to 330, face the first to third pixels PX1 to PX3, respectively.

As an example, a filling material 500 may be between the color filter unit (i.e., units above the filling material 500) and the display unit (i.e., units below the filling material 500). The filling material 500 may serve as a buffer against external pressure, etc. The filling material 500 may include an organic material such as methyl silicone, phenyl silicone, polyimide, etc., urethane-based resin, epoxy-based resin, and acryl-based resin, which are organic sealants, or silicone which is an inorganic sealant. However, the invention is not limited to the above-described examples.

As another example, the color filter unit and the display unit may be bonded through an adhesive layer (not shown). The adhesive layer may be, for example, optically clear adhesive ("OCA"), but is not limited thereto.

FIGS. 16 to 21 are schematic cross-sectional views of a process of manufacturing the color filter unit, which is a portion of a display apparatus according to the present embodiment.

Figure 16:
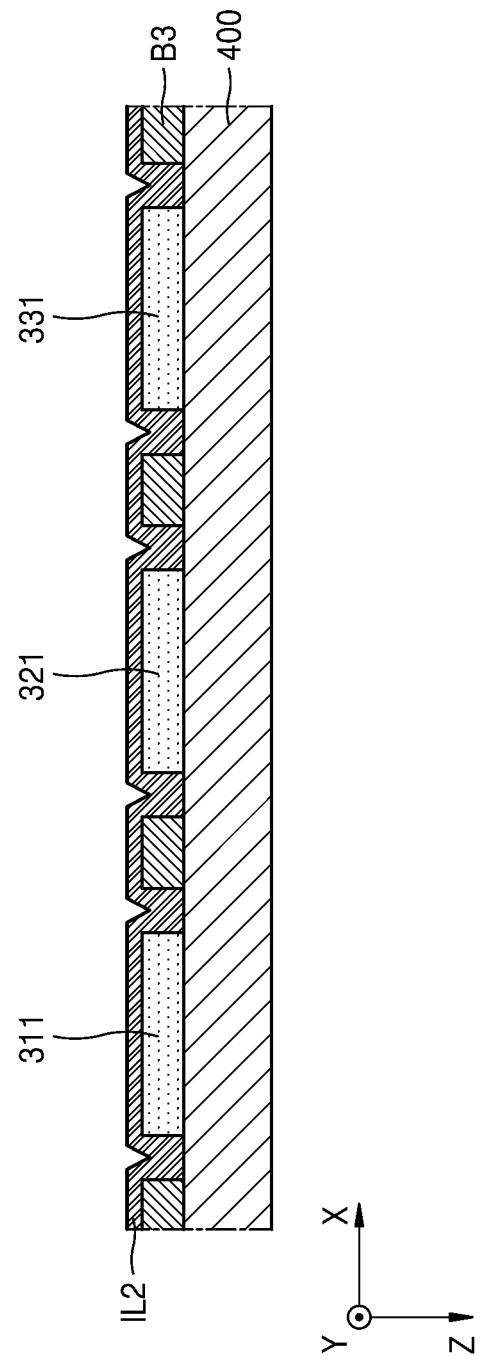
FIGS. 16 to 21 are schematic cross-sectional views of a process of manufacturing a portion of the display apparatus of FIG. 15.
Figure 17:
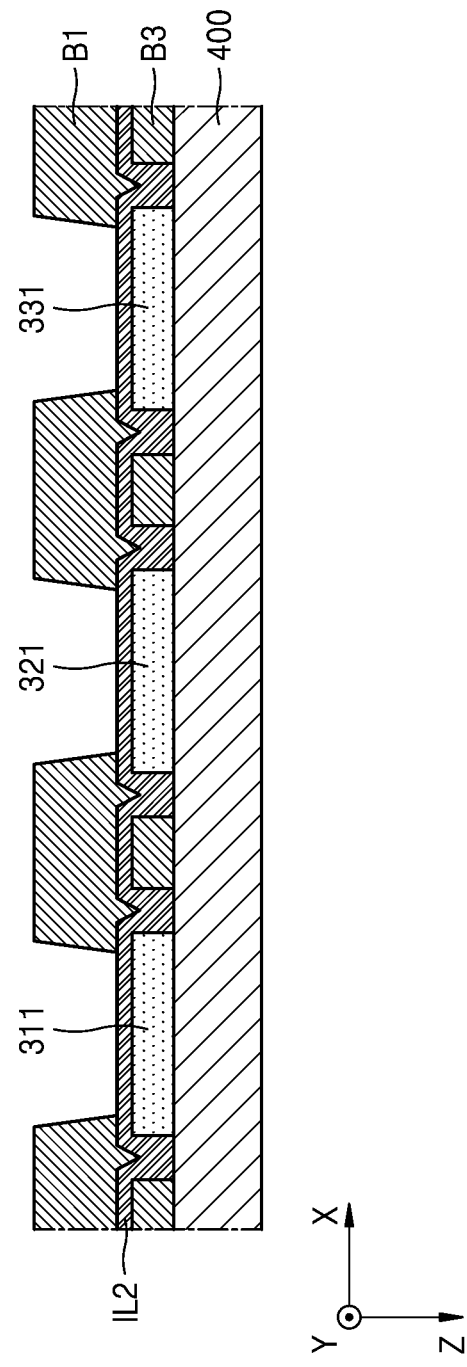
Figure 18:
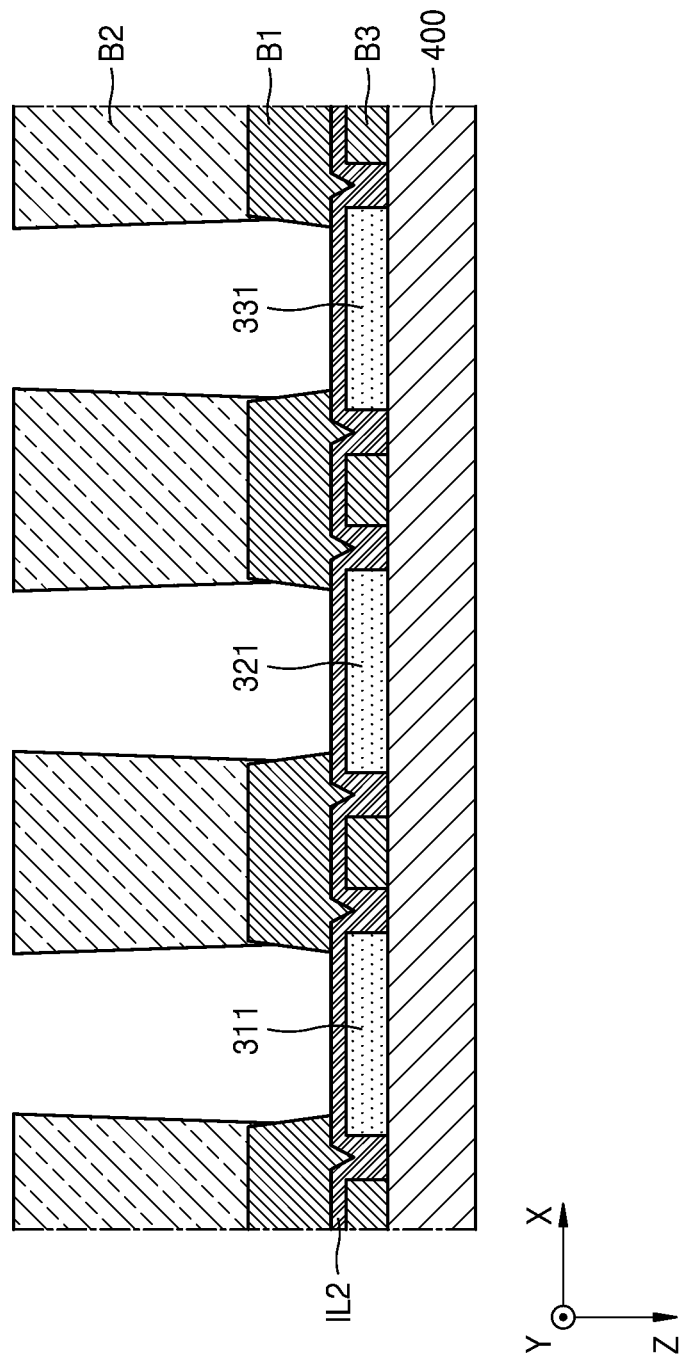
Figure 19:
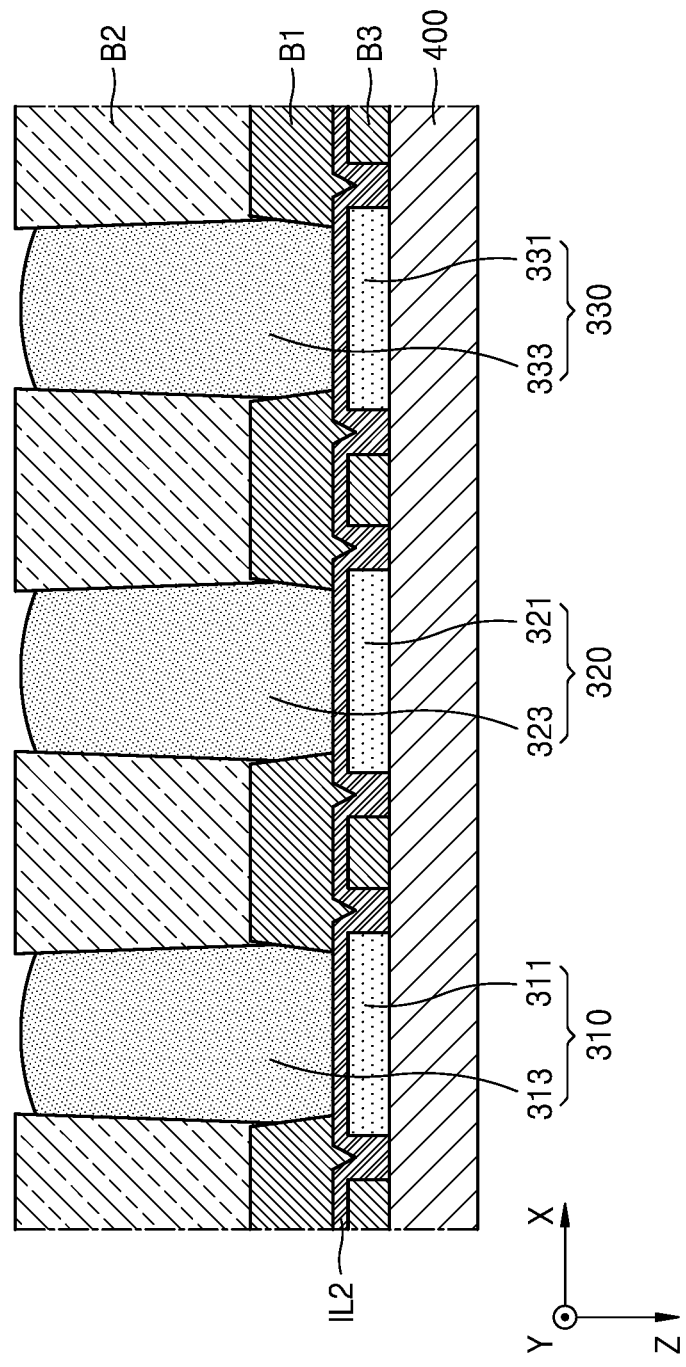
Figure 20:
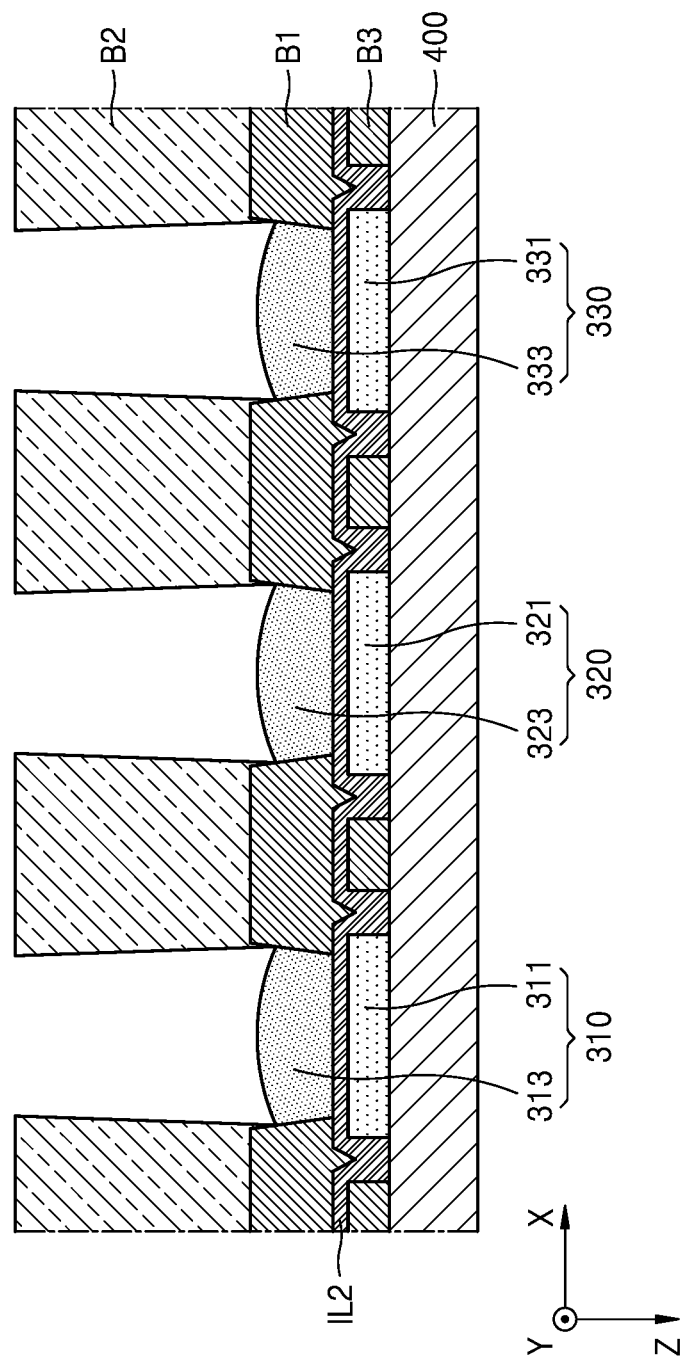
Figure 21:
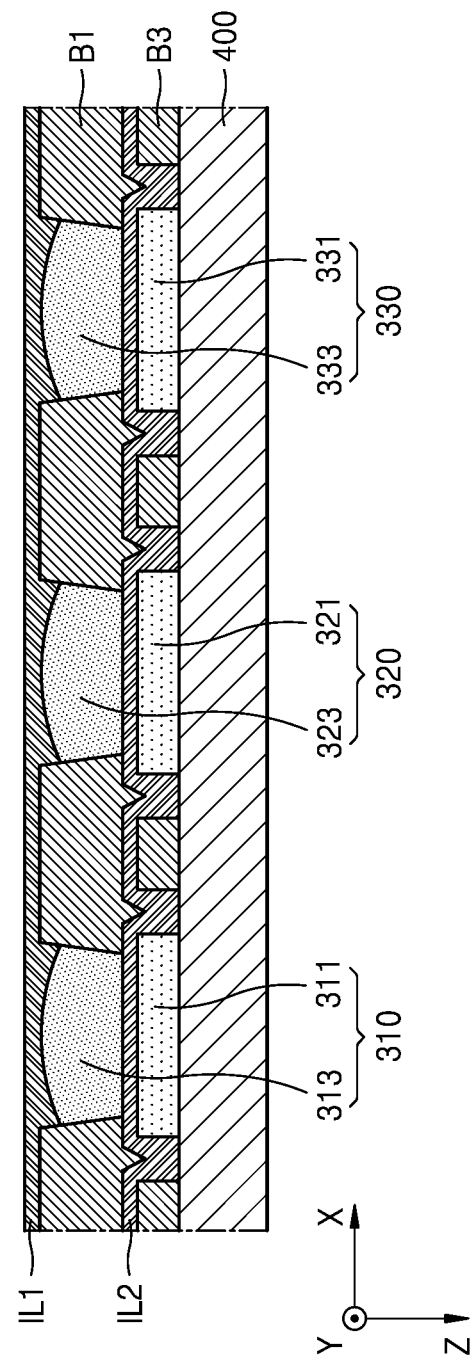

As shown in FIG. 16, color filter layers, for example, the first to third color filter layers 311 to 331, are formed on the first surface of the upper substrate 400, and a protective layer (e.g., the second insulating layer IL2) is formed to cover the color filter layers, for example, the first to third color filter layers 311 to 331. In this regard, the protective layer may include the same material as the first insulating layer IL1 or the second insulating layer IL2 of the first embodiment.

Next, as shown in FIGS. 17 to 21, the light-transmissive layer 313, the second color quantum dot layer 323, and the third color quantum dot layer 333 are formed above the color filter layers, for example, the first to third color filter layers 311 to 331, respectively. More specifically, the light-transmissive layer 313, the second color quantum dot layer 323, and the third color quantum dot layer 333 are formed above the color filter layers, for example, the first to third color filter layers 311 to 331, respectively, through an operation of forming, on the protective layer, the first partition walls B1 defining first to third color regions, an operation of forming the second partition walls B2 on the first partition walls B1, an operation of forming a second color quantum dot layer in the second color region and forming a third color quantum dot layer in the third color region, and an operation of removing the second partition walls B2. The same descriptions of a method of manufacturing a display apparatus according to the first embodiment described above also apply to the above operations, and thus, a redundant description thereof is omitted.

That is, a display apparatus according to the first embodiment and a display apparatus according to the second embodiment differ only in whether a color filter unit is separately manufactured or not and an order of forming color filter layers, for example, the first to third color filter layers 311 to 331, and quantum dot layers, for example, the second and third color quantum dot layers 323 and 333, and have the same technology applied to detailed manufacturing operations. Specifically, the display apparatus according to the first embodiment is manufactured by arranging filter portions, for example, the first to third color filter portions 310 to 330, directly on a display element layer without separately manufacturing a color filter unit. In addition, in the manufacturing operations of the display apparatus according to the first embodiment, quantum dot layers, for example, the second and third color quantum dot layers 323 and 333, are formed and then color filter layers, for example, the first to third color filter layers 311 to 331, are formed on the quantum dot layers. On the other hand, the display apparatus according to the second embodiment is manufactured by separately manufacturing and bonding a color filter unit to an upper portion of a display unit. In addition, in the manufacturing operations of the display apparatus according to the first embodiment, color filter layers, for example, the first to third color filter layers 311 to 331, are formed and then quantum dot layers, for example, the second and third color quantum dot layers 323 and 333, are formed on the color filter layers, during the manufacture of a color filter unit.

Figure 22:
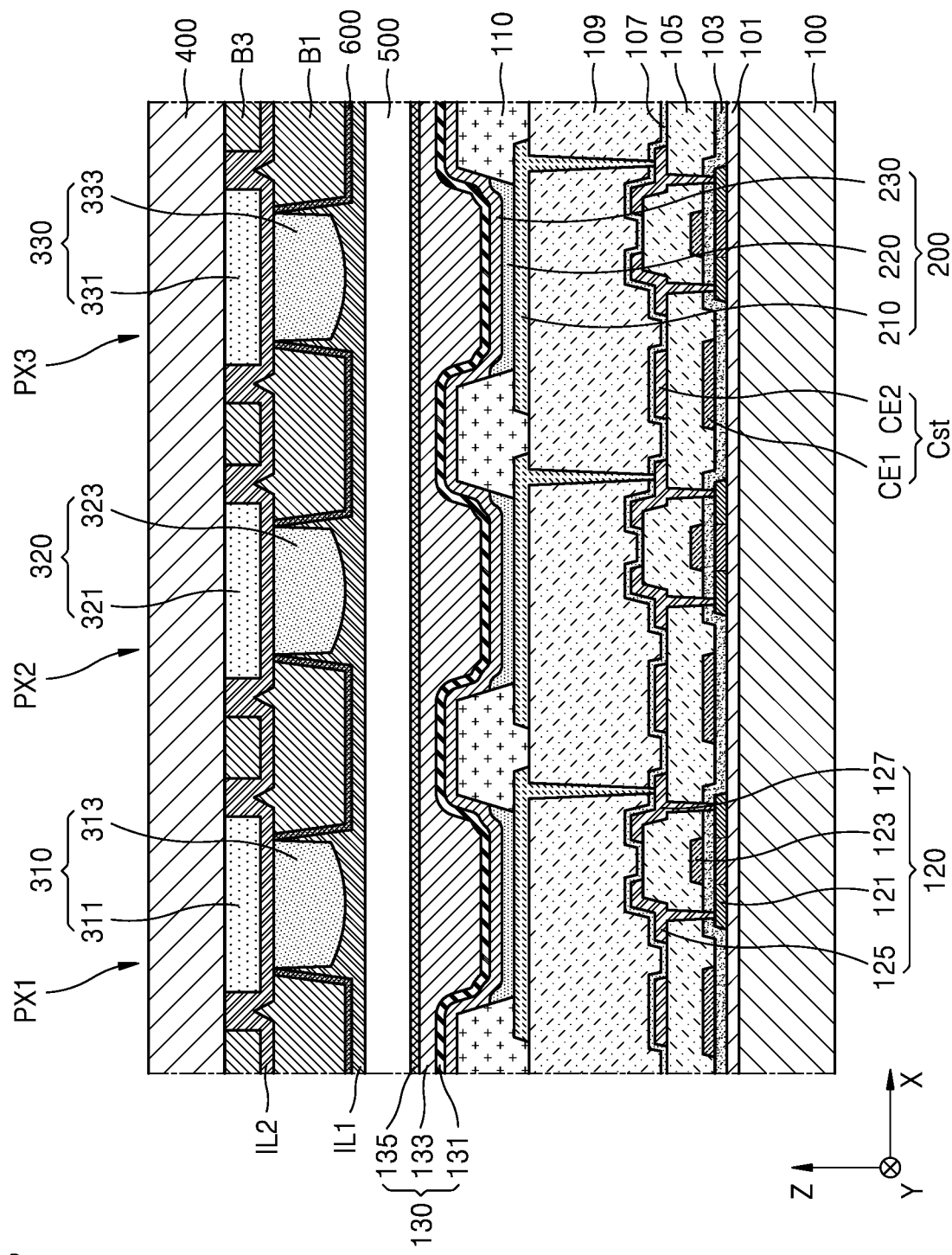
FIG. 22 is a schematic cross-sectional view of a portion of a modified example of the display apparatus of FIG. 15.

FIG. 22 is a schematic cross-sectional view of a portion of a modified example of the display apparatus of FIG. 15 (a modified example of the second embodiment).

As shown in FIG. 22, like the modified example of the first embodiment, the modified example of the display apparatus of FIG. 15 (the modified example of the second embodiment) may also further include the reflective plate 600. A detailed configuration and manufacturing method of the reflective plate 600 of the first embodiment may be applied to the reflective plate 600 of the second embodiment in the same way.

According to one or more of the above embodiments, a method of manufacturing a display apparatus whereby the efficiency of a quantum dot layer may improve may be implemented. However, the disclosure is not limited by such an effect.

While a method of manufacturing a display apparatus has been mainly described, the disclosure is not limited thereto. For example, it will be understood that a display apparatus manufactured by the method of manufacturing a display apparatus also falls within the scope of the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a lower substrate;
a display element layer above the lower substrate, wherein the display element layer comprises first to third display elements;
an encapsulation layer on the display element layer;
partition walls on the encapsulation layer to define first to third color regions, wherein the first to third color regions overlap the first to third display elements, respectively, in a view in a direction perpendicular to the lower substrate;
a quantum dot layer comprising a second color quantum dot layer in the second color region and a third color quantum dot layer in the third color region;
a reflective plate covering at least part of a surface of the partition walls, and
an insulating layer on the partition walls and the quantum dot layer,
wherein the reflective plate has a first surface and a second surface opposite to the first surface, the first surface is directly attached to the partition walls and the second surface is directly attached to the insulating layer.

2. The display apparatus of claim 1, wherein the reflective plate is between the partition walls and the quantum dot layer.

3. The display apparatus of claim 1, wherein the reflective plate covers a side surface of the partition walls.

4. The display apparatus of claim 1, further comprising:
a light-transmissive layer in the first color region; and
wherein the insulating layer is disposed on the light-transmissive layer.

5. The display apparatus of claim 4, further comprising a color filter layer on the insulating layer, which comprises a first color filter layer corresponding to the light-transmissive layer, a second color filter layer corresponding to the second color quantum dot layer, and a third color filter layer corresponding to the third color quantum dot layer.

6. The display apparatus of claim 1, wherein the first to third display elements comprise a first color emission layer configured to emit light of a wavelength in a first wavelength band.

7. The display apparatus of claim 6, wherein the second color quantum dot layer is configured to convert the light of the wavelength in the first wavelength band into light of a wavelength in a second wavelength band, and the third color quantum dot layer is configured to convert the light of the wavelength in the first wavelength band into light of a wavelength in a third wavelength band.

8. The display apparatus of claim 6, wherein the first to third display elements comprise:
first to third pixel electrodes, respectively; and
an opposite electrode corresponding to the first to third pixel electrodes, respectively,
wherein the first color emission layer is between the opposite electrode and each of the first to third pixel electrodes.

9. A display apparatus comprising:
an upper substrate having a first surface;
a color filter layer on the first surface of the upper substrate;
a protective layer on the color filter layer;
partition walls on the protective layer, wherein the partition walls define first to third color regions;
a quantum dot layer comprising a second color quantum dot layer in the second color region and a third color quantum dot layer in the third color region; and
a reflective plate covering at least part of a surface of the partition walls,
wherein the color filter layer is configured to pass only light having a limited wavelength,
wherein the color filter layer is disposed between the upper substrate and the protective layer.

10. The display apparatus of claim 9, wherein the reflective plate is between the partition walls and the quantum dot layer.

11. The display apparatus of claim 9, wherein the reflective plate covers a side surface of the partition walls.

12. The display apparatus of claim 9, further comprising:
a light-transmissive layer in the first color region; and
an insulating layer on the partition walls, the quantum dot layer, and the light-transmissive layer,
wherein the reflective plate is between the partition walls and the insulating layer.

13. The display apparatus of claim 12, wherein the color filter layer comprises a first color filter layer under the light-transmissive layer, a second color filter layer under the second color quantum dot layer, and a third color filter layer under the third color quantum dot layer.

14. The display apparatus of claim 9, further comprising:

a lower substrate having a second surface opposite to the first surface of the upper substrate;

a display element layer on the second surface of the lower substrate, wherein the display element layer comprises first to third display elements, wherein the first to third display elements comprise a first color emission layer configured to emit light in a first wavelength band, wherein the second color quantum dot layer is configured to convert the light in the first wavelength band into light in a second wavelength band, and the third color quantum dot layer is configured to convert the light in the first wavelength band into light in a third wavelength band.

15. The display apparatus of claim 14, wherein the first to third display elements comprise:

first to third pixel electrodes, respectively; and an opposite electrode corresponding to the first to third pixel electrodes, respectively, wherein the first color emission layer is between the opposite electrode and each of the first to third pixel electrodes.

16. A display apparatus comprising:

a lower substrate;

a display element layer above the lower substrate, wherein the display element layer comprises first to third display elements;

an encapsulation layer on the display element layer;

partition walls on the encapsulation layer to define first to third color regions, wherein the first to third color regions overlap the first to third display elements, respectively, in a view in a direction perpendicular to the lower substrate;

a quantum dot layer comprising a second color quantum dot layer in the second color region and a third color quantum dot layer in the third color region; and a reflective plate covering at least part of a surface of the partition walls, wherein the first to third display elements comprise a first color emission layer configured to emit light of a wavelength in a first wavelength band, wherein the first to third display elements comprise:

first to third pixel electrodes, respectively; and an opposite electrode corresponding to the first to third pixel electrodes, respectively, wherein the first color emission layer is between the opposite electrode and each of the first to third pixel electrodes.

\* \* \* \* \*